(12) United States Patent
Shalvi et al.

(10) Patent No.: US 8,259,497 B2
(45) Date of Patent: Sep. 4, 2012

(54) PROGRAMMING SCHEMES FOR MULTI-LEVEL ANALOG MEMORY CELLS

(75) Inventors: Ofir Shalvi, Ra'anana (IL); Naftali Sommer, Rishon Le-Zion (IL); Dotan Sokolov, Ra'anana (IL); Yoav Kasorla, Kfar Neter (IL)

(73) Assignee: Apple Inc., Cupertino, CA (US)

( * ) Notice: Subject to any disclaimer, the term of this patent is extended or adjusted under 35 U.S.C. 154(b) by 1064 days.

(21) Appl. No.: 12/186,867

(22) Filed: Aug. 6, 2008

(65) Prior Publication Data

US 2009/0043951 A1 Feb. 12, 2009

Related U.S. Application Data

(60) Provisional application No. 60/954,169, filed on Aug. 6, 2007, provisional application No. 60/954,317, filed on Aug. 7, 2007, provisional application No. 60/970,058, filed on Sep. 5, 2007, provisional application No. 60/985,236, filed on Nov. 4, 2007.

(51) Int. Cl.
*G11C 16/34* (2006.01)
*G11C 16/26* (2006.01)
*G11C 16/06* (2006.01)
*G11C 29/52* (2006.01)
*G11C 16/10* (2006.01)

(52) U.S. Cl. ......... 365/185.09; 365/185.02; 365/185.03; 365/185.2; 365/185.21; 365/185.22; 365/185.24; 711/103; 711/E12.008

(58) Field of Classification Search .................. 711/103, 711/E12.008; 365/185.03, 185.09, 185.24, 365/185.02, 185.2, 185.21, 185.22
See application file for complete search history.

(56) References Cited

U.S. PATENT DOCUMENTS

| 3,668,631 A | 6/1972 | Griffith et al. |
|---|---|---|
| 3,668,632 A | 6/1972 | Oldham |
| 4,058,851 A | 11/1977 | Scheuneman |
| 4,112,502 A | 9/1978 | Scheuneman |
| 4,394,763 A | 7/1983 | Nagano et al. |
| 4,413,339 A | 11/1983 | Riggle et al. |
| 4,556,961 A | 12/1985 | Iwahashi et al. |
| 4,558,431 A | 12/1985 | Satoh |
| 4,608,687 A | 8/1986 | Dutton |
| 4,654,847 A | 3/1987 | Dutton |

(Continued)

FOREIGN PATENT DOCUMENTS

EP 0783754 B1 7/1997

(Continued)

OTHER PUBLICATIONS

U.S. Appl. No. 11/995,814 Official Action dated Dec. 17, 2010.

(Continued)

*Primary Examiner* — J. H. Hur
(74) *Attorney, Agent, or Firm* — Meyertons, Hood, Kivlin, Kowert & Goetzel, P.C.

(57) ABSTRACT

A method for data storage includes storing first data bits in a set of multi-bit analog memory cells at a first time by programming the memory cells to assume respective first programming levels. Second data bits are stored in the set of memory cells at a second time that is later than the first time by programming the memory cells to assume respective second programming levels that depend on the first programming levels and on the second data bits. A storage strategy is selected responsively to a difference between the first and second times. The storage strategy is applied to at least one group of the data bits, selected from among the first data bits and the second data bits.

33 Claims, 4 Drawing Sheets

U.S. PATENT DOCUMENTS

| | | |
|---|---|---|
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,077,722 A | 12/1991 | Geist et al. |
| 5,126,808 A | 6/1992 | Montalvo et al. |
| 5,163,021 A | 11/1992 | Mehrotra et al. |
| 5,172,338 A | 12/1992 | Mehrotra et al. |
| 5,182,558 A | 1/1993 | Mayo |
| 5,182,752 A | 1/1993 | DeRoo et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Shirai |
| 5,416,782 A | 5/1995 | Wells et al. |
| 5,446,854 A | 8/1995 | Khalidi et al. |
| 5,450,424 A | 9/1995 | Okugaki et al. |
| 5,469,444 A | 11/1995 | Endoh et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,533,190 A | 7/1996 | Binford et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair et al. |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koning |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,798,966 A | 8/1998 | Keeney |
| 5,799,200 A | 8/1998 | Brant et al. |
| 5,801,985 A | 9/1998 | Roohparvar et al. |
| 5,838,832 A | 11/1998 | Barnsley |
| 5,860,106 A | 1/1999 | Domen et al. |
| 5,867,114 A | 2/1999 | Barbir |
| 5,867,428 A | 2/1999 | Ishii et al. |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,946,716 A | 8/1999 | Karp et al. |
| 5,969,986 A | 10/1999 | Wong et al. |
| 5,982,668 A | 11/1999 | Ishii et al. |
| 5,991,517 A | 11/1999 | Harari et al. |
| 5,995,417 A | 11/1999 | Chen et al. |
| 6,009,014 A | 12/1999 | Hollmer et al. |
| 6,009,016 A | 12/1999 | Ishii et al. |
| 6,023,425 A | 2/2000 | Ishii et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,151,246 A | 11/2000 | So et al. |
| 6,157,573 A | 12/2000 | Ishii et al. |
| 6,166,962 A | 12/2000 | Chen et al. |
| 6,169,691 B1 | 1/2001 | Pasotti et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,259,627 B1 | 7/2001 | Wong |
| 6,275,419 B1 | 8/2001 | Guterman et al. |
| 6,278,632 B1 | 8/2001 | Chevallier |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,307,776 B1 | 10/2001 | So et al. |
| 6,314,044 B1 | 11/2001 | Sasaki et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,385,092 B1 | 5/2002 | Ishii et al. |
| 6,392,932 B1 | 5/2002 | Ishii et al. |
| 6,396,742 B1 | 5/2002 | Korsh et al. |
| 6,397,364 B1 | 5/2002 | Barkan |
| 6,405,323 B1 | 6/2002 | Lin et al. |
| 6,405,342 B1 | 6/2002 | Lee |
| 6,418,060 B1 | 7/2002 | Yong et al. |
| 6,442,585 B1 | 8/2002 | Dean et al. |
| 6,445,602 B1 | 9/2002 | Kokudo et al. |
| 6,452,838 B1 | 9/2002 | Ishii et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,480,948 B1 | 11/2002 | Virajpet et al. |
| 6,490,236 B1 | 12/2002 | Fukuda et al. |
| 6,522,580 B2 | 2/2003 | Chen et al. |
| 6,525,952 B2 | 2/2003 | Araki et al. |
| 6,532,556 B1 | 3/2003 | Wong et al. |
| 6,538,922 B1 | 3/2003 | Khalid et al. |
| 6,549,464 B2 | 4/2003 | Tanaka et al. |
| 6,553,510 B1 | 4/2003 | Pekny et al. |
| 6,558,967 B1 | 5/2003 | Wong |
| 6,560,152 B1 | 5/2003 | Cernea |
| 6,567,311 B2 | 5/2003 | Ishii et al. |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzales et al. |
| 6,640,326 B1 | 10/2003 | Buckingham et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,683,811 B2 | 1/2004 | Ishii et al. |
| 6,687,155 B2 | 2/2004 | Nagasue |
| 6,707,748 B2 | 3/2004 | Lin et al. |
| 6,708,257 B2 | 3/2004 | Bao |
| 6,714,449 B2 | 3/2004 | Khalid |
| 6,717,847 B2 | 4/2004 | Chen |
| 6,731,557 B2 | 5/2004 | Beretta |
| 6,732,250 B2 | 5/2004 | Durrant |
| 6,738,293 B1 | 5/2004 | Iwahashi |
| 6,751,766 B2 | 6/2004 | Guterman et al. |
| 6,757,193 B2 | 6/2004 | Chen et al. |
| 6,774,808 B1 | 8/2004 | Hibbs et al. |
| 6,781,877 B2 | 8/2004 | Cernea et al. |

| Patent | Date | Inventor |
|---|---|---|
| 6,804,805 B2 | 10/2004 | Rub |
| 6,807,095 B2 | 10/2004 | Chen et al. |
| 6,807,101 B2 | 10/2004 | Ooishi et al. |
| 6,809,964 B2 | 10/2004 | Moschopoulos et al. |
| 6,819,592 B2 | 11/2004 | Noguchi et al. |
| 6,829,167 B2 | 12/2004 | Tu et al. |
| 6,845,052 B1 | 1/2005 | Ho et al. |
| 6,851,018 B2 | 2/2005 | Wyatt et al. |
| 6,851,081 B2 | 2/2005 | Yamamoto |
| 6,856,546 B2 | 2/2005 | Guterman et al. |
| 6,862,218 B2 | 3/2005 | Guterman et al. |
| 6,870,767 B2 | 3/2005 | Rudelic et al. |
| 6,870,773 B2 | 3/2005 | Noguchi et al. |
| 6,873,552 B2 | 3/2005 | Ishii et al. |
| 6,879,520 B2 | 4/2005 | Hosono et al. |
| 6,882,567 B1 | 4/2005 | Wong |
| 6,894,926 B2 | 5/2005 | Guterman et al. |
| 6,907,497 B2 | 6/2005 | Hosono et al. |
| 6,925,009 B2 | 8/2005 | Noguchi et al. |
| 6,930,925 B2 | 8/2005 | Guo et al. |
| 6,934,188 B2 | 8/2005 | Roohparvar |
| 6,937,511 B2 | 8/2005 | Hsu et al. |
| 6,958,938 B2 | 10/2005 | Noguchi et al. |
| 6,963,505 B2 | 11/2005 | Cohen |
| 6,972,993 B2 | 12/2005 | Conley et al. |
| 6,988,175 B2 | 1/2006 | Lasser |
| 6,992,932 B2 | 1/2006 | Cohen |
| 6,999,344 B2 | 2/2006 | Hosono et al. |
| 7,002,843 B2 | 2/2006 | Guterman et al. |
| 7,006,379 B2 | 2/2006 | Noguchi et al. |
| 7,012,835 B2 | 3/2006 | Gonzales et al. |
| 7,020,017 B2 | 3/2006 | Chen et al. |
| 7,023,735 B2 | 4/2006 | Ban et al. |
| 7,031,210 B2 | 4/2006 | Park et al. |
| 7,031,214 B2 | 4/2006 | Tran |
| 7,031,216 B2 | 4/2006 | You |
| 7,039,846 B2 | 5/2006 | Hewitt et al. |
| 7,042,766 B1 | 5/2006 | Wang et al. |
| 7,054,193 B1 | 5/2006 | Wong |
| 7,054,199 B2 | 5/2006 | Lee et al. |
| 7,057,958 B2 | 6/2006 | So et al. |
| 7,065,147 B2 | 6/2006 | Ophir et al. |
| 7,068,539 B2 | 6/2006 | Guterman et al. |
| 7,071,849 B2 | 7/2006 | Zhang |
| 7,072,222 B2 | 7/2006 | Ishii et al. |
| 7,079,555 B2 | 7/2006 | Baydar et al. |
| 7,088,615 B2 | 8/2006 | Guterman et al. |
| 7,099,194 B2 | 8/2006 | Tu et al. |
| 7,102,924 B2 | 9/2006 | Chen et al. |
| 7,113,432 B2 | 9/2006 | Mokhlesi |
| 7,130,210 B2 | 10/2006 | Bathul et al. |
| 7,139,192 B1 | 11/2006 | Wong |
| 7,139,198 B2 | 11/2006 | Guterman et al. |
| 7,145,805 B2 | 12/2006 | Ishii et al. |
| 7,151,692 B2 | 12/2006 | Wu |
| 7,158,058 B1 | 1/2007 | Yu |
| 7,170,781 B2 | 1/2007 | So et al. |
| 7,170,802 B2 | 1/2007 | Cernea et al. |
| 7,173,859 B2 | 2/2007 | Hemink |
| 7,177,184 B2 | 2/2007 | Chen |
| 7,177,195 B2 | 2/2007 | Gonzales et al. |
| 7,177,199 B2 | 2/2007 | Chen et al. |
| 7,177,200 B2 | 2/2007 | Ronen et al. |
| 7,184,338 B2 | 2/2007 | Nakagawa et al. |
| 7,187,195 B2 | 3/2007 | Kim |
| 7,187,592 B2 | 3/2007 | Guterman et al. |
| 7,190,614 B2 | 3/2007 | Wu |
| 7,193,898 B2 | 3/2007 | Cernea |
| 7,193,921 B2 | 3/2007 | Choi et al. |
| 7,196,644 B1 | 3/2007 | Anderson et al. |
| 7,196,928 B2 | 3/2007 | Chen |
| 7,196,933 B2 | 3/2007 | Shibata |
| 7,197,594 B2 | 3/2007 | Raz et al. |
| 7,200,062 B2 | 4/2007 | Kinsely et al. |
| 7,210,077 B2 | 4/2007 | Brandenberger et al. |
| 7,221,592 B2 | 5/2007 | Nazarian |
| 7,224,613 B2 | 5/2007 | Chen et al. |
| 7,231,474 B1 | 6/2007 | Helms et al. |
| 7,231,562 B2 | 6/2007 | Ohlhoff et al. |
| 7,243,275 B2 | 7/2007 | Gongwer et al. |
| 7,254,690 B2 | 8/2007 | Rao |
| 7,254,763 B2 | 8/2007 | Aadsen et al. |
| 7,257,027 B2 | 8/2007 | Park |
| 7,259,987 B2 | 8/2007 | Chen et al. |
| 7,266,026 B2 | 9/2007 | Gongwer et al. |
| 7,266,069 B2 | 9/2007 | Chu |
| 7,269,066 B2 | 9/2007 | Nguyen et al. |
| 7,272,757 B2 | 9/2007 | Stocken |
| 7,274,611 B2 | 9/2007 | Roohparvar |
| 7,277,355 B2 | 10/2007 | Tanzana |
| 7,280,398 B1 | 10/2007 | Lee et al. |
| 7,280,409 B2 | 10/2007 | Misumi et al. |
| 7,280,415 B2 | 10/2007 | Hwang et al. |
| 7,283,399 B2 | 10/2007 | Ishii et al. |
| 7,289,344 B2 | 10/2007 | Chen |
| 7,301,807 B2 | 11/2007 | Khalid et al. |
| 7,301,817 B2 | 11/2007 | Li et al. |
| 7,308,525 B2 | 12/2007 | Lasser et al. |
| 7,310,255 B2 | 12/2007 | Chan |
| 7,310,269 B2 | 12/2007 | Shibata |
| 7,310,271 B2 | 12/2007 | Lee |
| 7,310,272 B1 | 12/2007 | Mokhesi et al. |
| 7,310,347 B2 | 12/2007 | Lasser |
| 7,312,727 B1 | 12/2007 | Feng et al. |
| 7,321,509 B2 | 1/2008 | Chen et al. |
| 7,328,384 B1 | 2/2008 | Kulkarni et al. |
| 7,342,831 B2 | 3/2008 | Mokhlesi et al. |
| 7,343,330 B1 | 3/2008 | Boesjes et al. |
| 7,345,924 B2 | 3/2008 | Nguyen et al. |
| 7,345,928 B2 | 3/2008 | Li |
| 7,349,263 B2 | 3/2008 | Kim et al. |
| 7,356,755 B2 | 4/2008 | Fackenthal |
| 7,363,420 B2 | 4/2008 | Lin et al. |
| 7,365,671 B1 | 4/2008 | Anderson |
| 7,388,781 B2 | 6/2008 | Litsyn et al. |
| 7,397,697 B2 | 7/2008 | So et al. |
| 7,405,974 B2 | 7/2008 | Yaoi et al. |
| 7,405,979 B2 | 7/2008 | Ishii et al. |
| 7,408,804 B2 | 8/2008 | Hemink et al. |
| 7,408,810 B2 | 8/2008 | Aritome et al. |
| 7,409,473 B2 | 8/2008 | Conley et al. |
| 7,409,623 B2 | 8/2008 | Baker et al. |
| 7,420,847 B2 | 9/2008 | Li |
| 7,433,231 B2 | 10/2008 | Aritome |
| 7,433,697 B2 | 10/2008 | Karaoguz et al. |
| 7,434,111 B2 | 10/2008 | Sugiura et al. |
| 7,437,498 B2 | 10/2008 | Ronen |
| 7,440,324 B2 | 10/2008 | Mokhlesi |
| 7,440,331 B2 | 10/2008 | Hemink |
| 7,441,067 B2 | 10/2008 | Gorobetz et al. |
| 7,447,970 B2 | 11/2008 | Wu et al. |
| 7,450,421 B2 | 11/2008 | Mokhlesi et al. |
| 7,453,737 B2 | 11/2008 | Ha |
| 7,457,163 B2 | 11/2008 | Hemink |
| 7,457,897 B1 | 11/2008 | Lee et al. |
| 7,460,410 B2 | 12/2008 | Nagai et al. |
| 7,460,412 B2 | 12/2008 | Lee et al. |
| 7,466,592 B2 | 12/2008 | Mitani et al. |
| 7,468,907 B2 | 12/2008 | Kang et al. |
| 7,468,911 B2 | 12/2008 | Lutze et al. |
| 7,469,049 B1 | 12/2008 | Feng |
| 7,471,581 B2 | 12/2008 | Tran et al. |
| 7,483,319 B2 | 1/2009 | Brown |
| 7,487,329 B2 | 2/2009 | Hepkin et al. |
| 7,487,394 B2 | 2/2009 | Forhan et al. |
| 7,492,641 B2 | 2/2009 | Hosono et al. |
| 7,508,710 B2 | 3/2009 | Mokhlesi |
| 7,526,711 B2 | 4/2009 | Orio |
| 7,539,061 B2 | 5/2009 | Lee |
| 7,539,062 B2 | 5/2009 | Doyle |
| 7,551,492 B2 | 6/2009 | Kim |
| 7,558,109 B2 | 7/2009 | Brandman et al. |
| 7,558,839 B1 | 7/2009 | McGovern |
| 7,568,135 B2 | 7/2009 | Cornwell et al. |
| 7,570,520 B2 | 8/2009 | Kamei et al. |
| 7,574,555 B2 | 8/2009 | Porat et al. |
| 7,590,002 B2 | 9/2009 | Mokhlesi et al. |
| 7,593,259 B2 | 9/2009 | Kim et al. |

| | | | | | | |
|---|---|---|---|---|---|---|
| 7,594,093 | B1 | 9/2009 | Kancherla | 2006/0129750 A1 | 6/2006 | Lee et al. |
| 7,596,707 | B1 | 9/2009 | Vemula | 2006/0133141 A1 | 6/2006 | Gorobets |
| 7,609,787 | B2 | 10/2009 | Jahan et al. | 2006/0156189 A1 | 7/2006 | Tomlin |
| 7,613,043 | B2 | 11/2009 | Cornwell et al. | 2006/0179334 A1 | 8/2006 | Brittain et al. |
| 7,616,498 | B2 | 11/2009 | Mokhlesi et al. | 2006/0190699 A1 | 8/2006 | Lee |
| 7,619,918 | B2 | 11/2009 | Aritome | 2006/0203546 A1 | 9/2006 | Lasser |
| 7,631,245 | B2 | 12/2009 | Lasser | 2006/0218359 A1 | 9/2006 | Sanders et al. |
| 7,633,798 | B2 | 12/2009 | Sarin et al. | 2006/0221692 A1 | 10/2006 | Chen |
| 7,633,802 | B2 | 12/2009 | Mokhlesi | 2006/0221705 A1 | 10/2006 | Hemink et al. |
| 7,639,532 | B2 | 12/2009 | Roohparvar et al. | 2006/0221714 A1 | 10/2006 | Li et al. |
| 7,644,347 | B2 | 1/2010 | Alexander et al. | 2006/0239077 A1 | 10/2006 | Park et al. |
| 7,656,734 | B2 | 2/2010 | Thorp et al. | 2006/0239081 A1 | 10/2006 | Roohparvar |
| 7,660,158 | B2 | 2/2010 | Aritome | 2006/0256620 A1 | 11/2006 | Nguyen et al. |
| 7,660,183 | B2 | 2/2010 | Ware et al. | 2006/0256626 A1 | 11/2006 | Werner et al. |
| 7,661,000 | B2 | 2/2010 | Ueda et al. | 2006/0256891 A1 | 11/2006 | Yuan et al. |
| 7,661,054 | B2 | 2/2010 | Huffman et al. | 2006/0271748 A1 | 11/2006 | Jain et al. |
| 7,665,007 | B2 | 2/2010 | Yang et al. | 2006/0285392 A1 | 12/2006 | Incarnati et al. |
| 7,680,987 | B1 | 3/2010 | Clark et al. | 2006/0285396 A1 | 12/2006 | Ha |
| 7,733,712 | B1 | 6/2010 | Walston et al. | 2007/0006013 A1 | 1/2007 | Moshayedi et al. |
| 7,742,351 | B2 | 6/2010 | Inoue et al. | 2007/0019481 A1 | 1/2007 | Park |
| 7,761,624 | B2 | 7/2010 | Karamcheti et al. | 2007/0033581 A1 | 2/2007 | Tomlin et al. |
| 7,797,609 | B2 | 9/2010 | Neuman | 2007/0047314 A1 | 3/2007 | Goda et al. |
| 7,810,017 | B2 | 10/2010 | Radke | 2007/0047326 A1 | 3/2007 | Nguyen et al. |
| 7,848,149 | B2 | 12/2010 | Gonzales et al. | 2007/0050536 A1 | 3/2007 | Kolokowsky |
| 7,869,273 | B2 | 1/2011 | Lee et al. | 2007/0058446 A1 | 3/2007 | Hwang et al. |
| 7,885,119 | B2 | 2/2011 | Li | 2007/0061502 A1 | 3/2007 | Lasser et al. |
| 7,904,783 | B2 | 3/2011 | Brandman et al. | 2007/0067667 A1 | 3/2007 | Ikeuchi et al. |
| 7,928,497 | B2 | 4/2011 | Yaegashi | 2007/0074093 A1 | 3/2007 | Lasser |
| 7,929,549 | B1 | 4/2011 | Talbot | 2007/0086239 A1 | 4/2007 | Litsyn et al. |
| 7,930,515 | B2 | 4/2011 | Gupta et al. | 2007/0086260 A1 | 4/2007 | Sinclair |
| 7,945,825 | B2 | 5/2011 | Cohen et al. | 2007/0089034 A1 | 4/2007 | Litsyn et al. |
| 7,978,516 | B2 | 7/2011 | Olbrich et al. | 2007/0091677 A1 | 4/2007 | Lasser et al. |
| 8,014,094 | B1 | 9/2011 | Jin | 2007/0091694 A1 | 4/2007 | Lee et al. |
| 8,037,380 | B2 | 10/2011 | Cagno et al. | 2007/0103978 A1 | 5/2007 | Conley et al. |
| 8,040,744 | B2 | 10/2011 | Gorobets et al. | 2007/0103986 A1 | 5/2007 | Chen |
| 8,065,583 | B2 | 11/2011 | Radke | 2007/0104211 A1 | 5/2007 | Opsasnick |
| 2001/0002172 | A1 | 5/2001 | Tanaka et al. | 2007/0109845 A1 | 5/2007 | Chen |
| 2001/0006479 | A1 | 7/2001 | Ikehashi et al. | 2007/0109849 A1 | 5/2007 | Chen |
| 2002/0038440 | A1 | 3/2002 | Barkan | 2007/0115726 A1 | 5/2007 | Cohen et al. |
| 2002/0056064 | A1 | 5/2002 | Kidorf et al. | 2007/0118713 A1 | 5/2007 | Guterman et al. |
| 2002/0118574 | A1 | 8/2002 | Gongwer et al. | 2007/0143378 A1 | 6/2007 | Gorobetz |
| 2002/0133684 | A1 | 9/2002 | Anderson | 2007/0143531 A1 | 6/2007 | Atri |
| 2002/0166091 | A1 | 11/2002 | Kidorf et al. | 2007/0159889 A1 | 7/2007 | Kang et al. |
| 2002/0174295 | A1 | 11/2002 | Ulrich et al. | 2007/0159892 A1 | 7/2007 | Kang et al. |
| 2002/0196510 | A1 | 12/2002 | Hietala et al. | 2007/0159907 A1 | 7/2007 | Kwak |
| 2003/0002348 | A1 | 1/2003 | Chen et al. | 2007/0168837 A1 | 7/2007 | Murin |
| 2003/0103400 | A1 | 6/2003 | Van Tran | 2007/0171714 A1 | 7/2007 | Wu et al. |
| 2003/0161183 | A1 | 8/2003 | Van Tran | 2007/0183210 A1 | 8/2007 | Choi et al. |
| 2003/0189856 | A1 | 10/2003 | Cho et al. | 2007/0189073 A1 | 8/2007 | Aritome |
| 2004/0057265 | A1 | 3/2004 | Mirabel et al. | 2007/0195602 A1 | 8/2007 | Fong et al. |
| 2004/0057285 | A1 | 3/2004 | Cernea et al. | 2007/0206426 A1 | 9/2007 | Mokhlesi |
| 2004/0083333 | A1 | 4/2004 | Chang et al. | 2007/0208904 A1 | 9/2007 | Hsieh et al. |
| 2004/0083334 | A1 | 4/2004 | Chang et al. | 2007/0226599 A1 | 9/2007 | Motwani |
| 2004/0105311 | A1 | 6/2004 | Cernea et al. | 2007/0236990 A1 | 10/2007 | Aritome |
| 2004/0114437 | A1 | 6/2004 | Li | 2007/0253249 A1 | 11/2007 | Kang et al. |
| 2004/0160842 | A1 | 8/2004 | Fukiage | 2007/0256620 A1 | 11/2007 | Viggiano et al. |
| 2004/0223371 | A1 | 11/2004 | Roohparvar | 2007/0263455 A1 | 11/2007 | Cornwell et al. |
| 2005/0007802 | A1 | 1/2005 | Gerpheide | 2007/0266232 A1 | 11/2007 | Rodgers et al. |
| 2005/0013165 | A1 | 1/2005 | Ban | 2007/0271424 A1 | 11/2007 | Lee et al. |
| 2005/0024941 | A1 | 2/2005 | Lasser et al. | 2007/0280000 A1 | 12/2007 | Fujiu et al. |
| 2005/0024978 | A1 | 2/2005 | Ronen | 2007/0291571 A1 | 12/2007 | Balasundaram |
| 2005/0030788 | A1 | 2/2005 | Parkinson et al. | 2007/0297234 A1 | 12/2007 | Cernea et al. |
| 2005/0086574 | A1 | 4/2005 | Fackenthal | 2008/0010395 A1 | 1/2008 | Mylly et al. |
| 2005/0121436 | A1 | 6/2005 | Kamitani et al. | 2008/0025121 A1 | 1/2008 | Tanzawa |
| 2005/0144361 | A1 | 6/2005 | Gonzalez et al. | 2008/0043535 A1 | 2/2008 | Roohparvar |
| 2005/0157555 | A1 | 7/2005 | Ono et al. | 2008/0049504 A1 | 2/2008 | Kasahara et al. |
| 2005/0162913 | A1 | 7/2005 | Chen | 2008/0049506 A1 | 2/2008 | Guterman |
| 2005/0169051 | A1 | 8/2005 | Khalid et al. | 2008/0052446 A1 | 2/2008 | Lasser et al. |
| 2005/0189649 | A1 | 9/2005 | Maruyama et al. | 2008/0055993 A1 | 3/2008 | Lee |
| 2005/0213393 | A1 | 9/2005 | Lasser | 2008/0080243 A1 | 4/2008 | Edahiro et al. |
| 2005/0224853 | A1 | 10/2005 | Ohkawa | 2008/0082730 A1 | 4/2008 | Kim et al. |
| 2005/0240745 | A1 | 10/2005 | Iyer et al. | 2008/0089123 A1 | 4/2008 | Chae et al. |
| 2005/0243626 | A1 | 11/2005 | Ronen | 2008/0104309 A1 | 5/2008 | Cheon et al. |
| 2006/0004952 | A1 | 1/2006 | Lasser | 2008/0104312 A1 | 5/2008 | Lasser |
| 2006/0028875 | A1 * | 2/2006 | Avraham et al. ......... 365/185.24 | 2008/0109590 A1 | 5/2008 | Jung et al. |
| 2006/0028877 | A1 | 2/2006 | Meir | 2008/0115017 A1 | 5/2008 | Jacobson |
| 2006/0101193 | A1 | 5/2006 | Murin | 2008/0123420 A1 | 5/2008 | Brandman et al. |
| 2006/0106972 | A1 | 5/2006 | Gorobets et al. | 2008/0123426 A1 | 5/2008 | Lutze et al. |
| 2006/0107136 | A1 | 5/2006 | Gongwer et al. | 2008/0126686 A1 | 5/2008 | Sokolov et al. |

| | | |
|---|---|---|
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0263676 A1 | 10/2008 | Mo et al. |
| 2008/0270730 A1 | 10/2008 | Lasser et al. |
| 2008/0282106 A1 | 11/2008 | Shalvi et al. |
| 2008/0288714 A1 | 11/2008 | Salomon et al. |
| 2009/0013233 A1 | 1/2009 | Radke |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0172257 A1 | 7/2009 | Prins et al. |
| 2009/0172261 A1 | 7/2009 | Prins et al. |
| 2009/0193184 A1 | 7/2009 | Yu et al. |
| 2009/0199074 A1 | 8/2009 | Sommer et al. |
| 2009/0204824 A1 | 8/2009 | Lin et al. |
| 2009/0204872 A1 | 8/2009 | Yu et al. |
| 2009/0213653 A1 | 8/2009 | Perlmutter et al. |
| 2009/0213654 A1 | 8/2009 | Perlmutter et al. |
| 2009/0225595 A1 | 9/2009 | Kim |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0082883 A1 | 4/2010 | Chen et al. |
| 2010/0083247 A1 | 4/2010 | Kanevsky et al. |
| 2010/0110580 A1 | 5/2010 | Takashima |
| 2010/0131697 A1 | 5/2010 | Alrod et al. |
| 2010/0142268 A1 | 6/2010 | Aritome |
| 2010/0142277 A1 | 6/2010 | Yang et al. |
| 2010/0169547 A1 | 7/2010 | Ou |
| 2010/0169743 A1 | 7/2010 | Vogan et al. |
| 2010/0174847 A1 | 7/2010 | Paley et al. |
| 2010/0211803 A1 | 8/2010 | Lablans |
| 2010/0287217 A1 | 11/2010 | Borchers et al. |
| 2011/0010489 A1 | 1/2011 | Yeh |
| 2011/0060969 A1 | 3/2011 | Ramamoorthy et al. |
| 2011/0066793 A1 | 3/2011 | Burd |
| 2011/0075482 A1 | 3/2011 | Shepard et al. |
| 2011/0107049 A1 | 5/2011 | Kwon et al. |
| 2011/0149657 A1 | 6/2011 | Haratsch et al. |
| 2011/0199823 A1 | 8/2011 | Bar-Or et al. |
| 2011/0302354 A1 | 12/2011 | Miller |

FOREIGN PATENT DOCUMENTS

| | | |
|---|---|---|
| EP | 1434236 B1 | 6/2004 |
| EP | 1605509 A1 | 5/2009 |
| WO | 9610256 A1 | 4/1996 |
| WO | 9828745 A1 | 7/1998 |
| WO | 2002100112 A1 | 12/2002 |
| WO | 2003100791 A1 | 12/2003 |
| WO | 2007046084 A2 | 4/2007 |
| WO | 2007132452 A2 | 11/2007 |
| WO | 2007132456 A2 | 11/2007 |
| WO | 2007132458 A2 | 11/2007 |
| WO | WO-2007132453 | 11/2007 |
| WO | WO-2007132457 | 11/2007 |
| WO | 2007146010 A2 | 12/2007 |
| WO | WO-2008026203 | 3/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | WO-2008/111058 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |
| WO | 2011024015 A1 | 3/2011 |

OTHER PUBLICATIONS

U.S. Appl. No. 12/388,528 Official Action dated Nov. 29, 2010.
U.S. Appl. No. 12/251,471 Official Action dated Jan. 3, 2011.
Engineering Windows 7, "Support and Q&A for Solid-State Drives", e7blog, May 5, 2009.
Micron Technology Inc., "Memory Management in NAND Flash Arrays", Technical Note, year 2005.
Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.
Park et al., "Sub-Grouped Superblock Management for High-Performance Flash Storages", IEICE Electronics Express, vol. 6, No. 6, pp. 297-303, Mar. 25, 2009.
"How to Resolve "Bad Super Block: Magic Number Wrong" in BSD", Free Online Articles Director Article Base, posted Sep. 5, 2009.
Ubuntu Forums, "Memory Stick Failed IO Superblock", posted Nov. 11, 2009.
Super User Forums, "SD Card Failure, can't read superblock", posted Aug. 8, 2010.
U.S. Appl. No. 12/987,174 "Redundant Data Storage in Multi-Die Memory Systems", filed Jan. 10, 2011.
U.S. Appl. No. 12/987,175 "Redundant Data Storage Schemes for Multi-Die Memory Systems" filed Jan. 10, 2011.
U.S. Appl. No. 12/963,649 "Memory Management Schemes for Non-Volatile Memory Devices" filed Dec. 9, 2010.
U.S. Appl. No. 13/021,754 "Reducing Peak Current in Memory Systems" filed Feb. 6, 2011.
U.S. Appl. No. 12/019,011 Official Action dated Nov. 20, 2009.
Takeuchi et al., "A Multipage Cell Architecture for High-Speed Programming Multilevel NAND Flash Memories", IEEE Journal of Solid State Circuits, vol. 33, No. 8, Aug. 1998.

JEDEC STANDARD JESD84-C44, "Embedded MultiMediaCard (e•MMC) Mechanical Standard, with Optional Reset Signal", JEDEC Solid State Technology Association, USA, Jul. 2009.

JEDEC, "UFS Specification", version 0.1, Nov. 11, 2009.

SD Group and SD Card Association, "SD Specifications Part 1 Physical Layer Specification", version 3.01, draft 1.00, Nov. 9, 2009.

Compaq et al., "Universal Serial Bus Specification", revision 2.0, Apr. 27, 2000.

Serial ATA International Organization, "Serial ATA Revision 3.0 Specification", Jun. 2, 2009.

Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.

U.S. Appl. No. 12/534,898 Official Action dated Mar. 23, 2011.

U.S. Appl. No. 13/047,822, filed Mar. 15, 2011.

U.S. Appl. No. 13/069,406, filed Mar. 23, 2011.

U.S. Appl. No. 13/088,361, filed Apr. 17, 2011.

Ankolekar et al., "Multibit Error-Correction Methods for Latency-Constrained Flash Memory Systems", IEEE Transactions on Device and Materials Reliability, vol. 10, No. 1, pp. 33-39, Mar. 2010.

U.S. Appl. No. 12/344,233 Official Action dated Jun. 24, 2011.

U.S. Appl. No. 11/995,813 Official Action dated Jun. 16, 2011.

Berman et al., "Mitigating Inter-Cell Coupling Effects in MLC NAND Flash via Constrained Coding", Flash Memory Summit, Santa Clara, USA, Aug. 19, 2010.

U.S. Appl. No. 12/178,318 Official Action dated May 31, 2011.

CN Patent Application # 200780026181.3 Official Action dated Apr. 8, 2011.

Huffman, A., "Non-Volatile Memory Host Controller Interface (NVMHCI)", Specification 1.0, Apr. 14, 2008.

Panchbhai et al., "Improving Reliability of NAND Based Flash Memory Using Hybrid SLC/MLC Device", Project Proposal for CSci 8980—Advanced Storage Systems, University of Minnesota, USA, Spring 2009.

U.S. Appl. No. 11/957,970 Official Action dated May 20, 2010.

Shalvi et al., U.S. Appl. No. 12/822,207 "Adaptive Over-Provisioning in Memory Systems" filed Jun. 24, 2010.

Agrell et al., "Closest Point Search in Lattices", IEEE Transactions on Information Theory, vol. 48, No. 8, pp. 2201-2214, Aug. 2002.

Blahut, R.E., "Theory and Practice of Error Control Codes," Addison-Wesley, May, 1984, section 3.2, pp. 47-48.

Chang, L., "Hybrid Solid State Disks: Combining Heterogeneous NAND Flash in Large SSDs", ASPDAC, Jan. 2008.

Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Databahn™, "Flash memory controller IP", Denali Software, Inc., 1994 https://www.denali.com/en/products/databahn_flash.jsp.

Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Engh et al., "A self adaptive programming method with 5 mV accuracy for multi-level storage in Flash", pp. 115-118, Proceedings of the IEEE 2002 Custom Integrated Circuits Conference, May 12-15, 2002.

Goodman et al., "On-Chip ECC for Multi-Level Random Access Memories," Proceedings of the IEEE/CAM Information Theory Workshop, Ithaca, USA, Jun. 25-29, 1989.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, p. 103-112, Springer Berlin / Heidelberg, Aug. 25, 2006.

Horstein, "On the Design of Signals for Sequential and Nonsequential Detection Systems with Feedback," IEEE Transactions on Information Theory IT-12:4 (Oct. 1966), pp. 448-455.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference, New Orleans, Louisiana. 155-164.

Lee et al., "Effects of Floating Gate Interference on NAND Flash Memory Cell Operation", IEEE Electron Device Letters, vol. 23, No. 5, pp. 264-266, May 2002.

Mielke et al., "Recovery Effects in the Distributed Cycling of Flash Memories", IEEE 44th Annual International Reliability Physics Symposium, pp. 29-35, San Jose, USA, Mar. 2006.

Onfi, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management and NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.

International Application PCT/IL2007/000576 Search Report dated Jul. 7, 2008.

International Application PCT/IL2007/000579 Patentability report dated Mar. 10, 2009.

International Application PCT/IL2007/000579 Search report dated Jul 3, 2008.

International Application PCT/IL2007/000580 Patentability Report dated Mar. 10, 2009.

International Application PCT/IL2007/000580 Search Report dated Sep 11, 2008.

International Application PCT/IL2007/000581 Patentability Report dated Mar. 26, 2009.

International Application PCT/IL2007/000581 Search Report dated Aug 25, 2008.

International Application PCT/IL2007/001059 Patentability report dated Apr. 19, 2009.

International Application PCT/IL2007/001059 Search report dated Aug. 7, 2008.

International Application PCT/IL2007/001315 search report dated Aug 7, 2008.

International Application PCT/IL2007/001315 Patentability Report dated May 5, 2009.

International Application PCT/IL2007/001316 Search report dated Jul 22, 2008.

International Application PCT/IL2007/001316 Patentability Report dated May 5, 2009.

International Application PCT/IL2007/001488 Search report dated Jun. 20, 2008.

International Application PCT/IL2008/000329 Search report dated Nov 25, 2008.
International Application PCT/IL2008/000519 Search report dated Nov 20, 2008.
International Application PCT/IL2008/001188 Search Report dated Jan 28, 2009.
International Application PCT/IL2008/001356 Search Report dated Feb 3, 2009.
International Application PCT/IL2008/001446 Search report dated Feb 20, 2009.
Sommer, N., U.S. Appl. No. 12/171,797 "Memory Device with Non-Uniform Programming Levels" filed on Jul. 11, 2008.
US 7,161,836, 01/2007, Wan et al. (withdrawn).
U.S. Appl. No. 11/949,135 Official Action dated Oct. 2, 2009.
Wei, L., "Trellis-Coded Modulation With Multidimensional Constellations", IEEE Transactions on Information Theory, vol. IT-33, No. 4, pp. 483-501, Jul. 1987.
U.S. Appl. No. 13/114,049 Official Action dated Sep. 12, 2011.
U.S. Appl. No. 12/405,275 Official Action dated Jul. 29, 2011.
Conway et al., "Sphere Packings, Lattices and Groups", 3rd edition, chapter 4, pp. 94-135, Springer, New York, USA 1998.
Chinese Patent Application # 200780040493.X Official Action dated Jun. 15, 2011.
U.S. Appl. No. 12/037,487 Official Action dated Oct. 3, 2011.
U.S. Appl. No. 12/649,360 Official Action dated Aug. 9, 2011.
U.S. Appl. No. 13/192,504, filed Jul. 28, 2011.
U.S. Appl. No. 13/192,852, filed Aug. 2, 2011.
U.S. Appl. No. 13/231,963, filed Sep. 14, 2011.
U.S. Appl. No. 13/239,408, filed Sep. 22, 2011.
U.S. Appl. No. 13/239,411, filed Sep. 22, 2011.
U.S. Appl. No. 13/214,257, filed Aug. 22, 2011.
U.S. Appl. No. 13/192,501, filed Jul. 28, 2011.
U.S. Appl. No. 13/192,495, filed Jul. 28, 2011.
U.S. Appl. No. 11/995,814, entitled "Reading Memory Cells Using Multiple Thresholds," filed Jan. 15, 2008.
U.S. Appl. No. 12/880,101 "Reuse of Host Hibernation Storage Space by Memory Controller", filed Sep. 12, 2010.
U.S. Appl. No. 12/890,724 "Error Correction Coding Over Multiple Memory Pages", filed Sep. 27, 2010.
U.S. Appl. No. 12/171,797 Official Action dated Aug. 25, 2010.
U.S. Appl. No. 12/497,707 Official Action dated Sep. 15, 2010.
U.S. Appl. No. 11/995,801 Official Action dated Oct. 15, 2010.
Numonyx, "M25PE16: 16-Mbit, page-erasable serial flash memory with byte-alterability, 75 MHz SPI bus, standard pinout", Apr. 2008.
Eitan et al., "Can NROM, a 2-bit, Trapping Storage NVM Cell, Give a Real Challenge to Floating Gate Cells?" (1999).
Eitan et al., "Multilevel Flash Cells and Their Trade-Offs" (1996).
Maayan et al., "A 512Mb NROM Flash Data Storage Memory with 8MB/s Data Rate" (2002).
Bez et al., "Introduction to Flash Memory" (2003).
Kim et al., "Future Memory Technology including Emerging New Memories" (2004).
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
U.S. Appl. No. 11/945,575 Official Action dated Aug. 24, 2010.
U.S. Appl. No. 12/045,520 Official Action dated Nov. 16, 2010.
U.S. Appl. No. 12/323,544 Official Action dated Mar. 9, 2012.
Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
U.S. Appl. No. 12/522,175 Official Action dated Mar. 27, 2012.
U.S. Appl. No. 12/607,085 Official Action dated Mar. 28, 2012.
Budilovsky et al., "Prototyping a High-Performance Low-Cost Solid-State Disk", Systor—The 4th Annual International Systems and Storage Conference, Haifa, Israel, May 30-Jun. 1, 2011.
NVM Express Protocol, "NVM Express", Revision 1.0b, Jul. 12, 2011.
SCSI Protocol, "Information Technology-13 SCSI Architecture Model—5 (SAM-5)", INCITS document T10/2104-D, revision 01, Jan. 28, 2009.
SAS Protocol, "Information Technology—Serial Attached SCSI—2 (SAS-2)", INCITS document T10/1760-D, revision 15a, Feb. 22, 2009.
U.S. Appl. No. 12/323,544 Office Action dated Dec. 13, 2011.
U.S. Appl. No. 12/332,368 Office Action dated Nov. 10, 2011.
U.S. Appl. No. 12/063,544 Office Action dated Dec. 14, 2011.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed Oct. 30, 2011.
U.S. Appl. No. 13/284,913, filed Oct. 30, 2011.
U.S. Appl. No. 13/338,335, filed Dec. 28, 2011.
U.S. Appl. No. 13/355,536, filed Jan. 22, 2012.

* cited by examiner

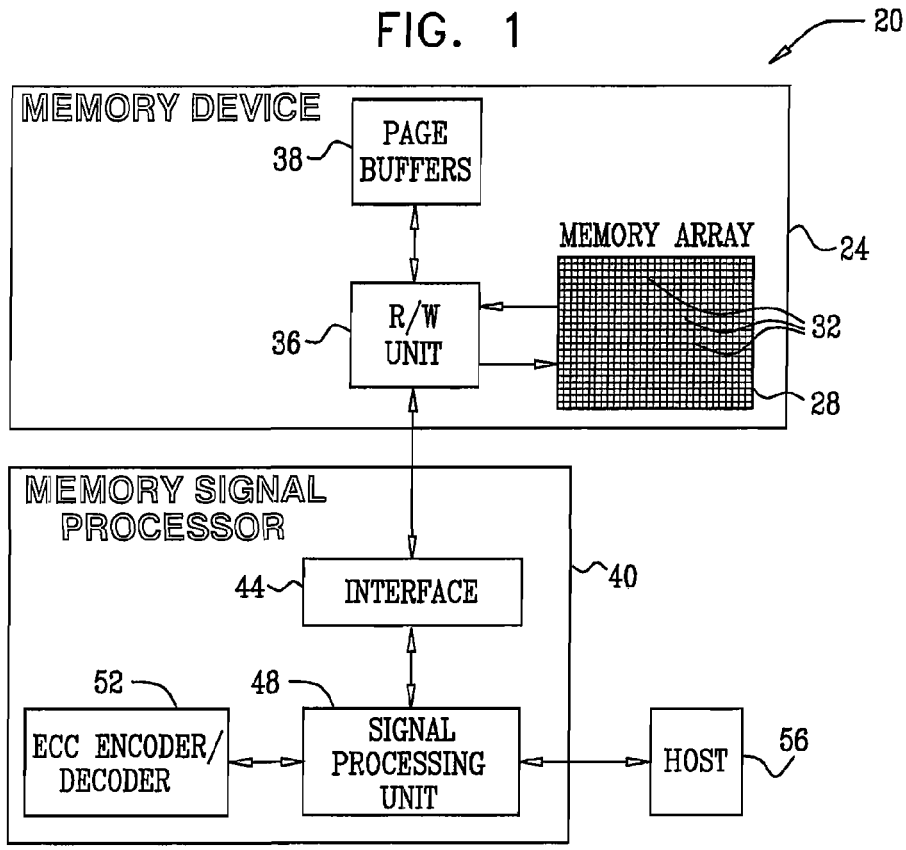
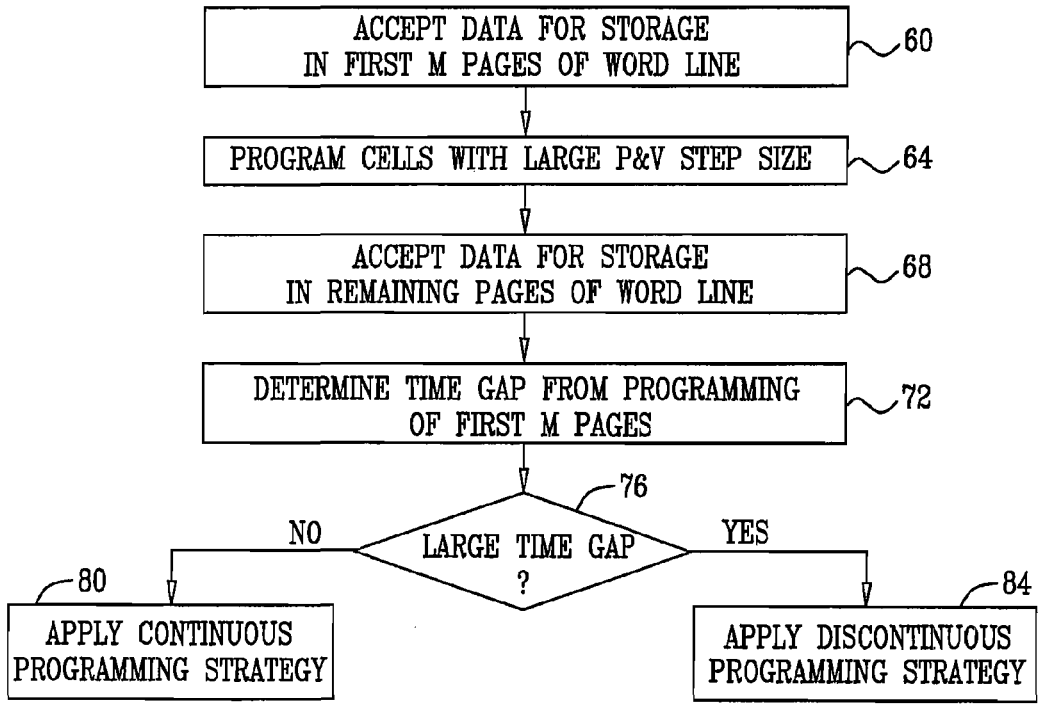

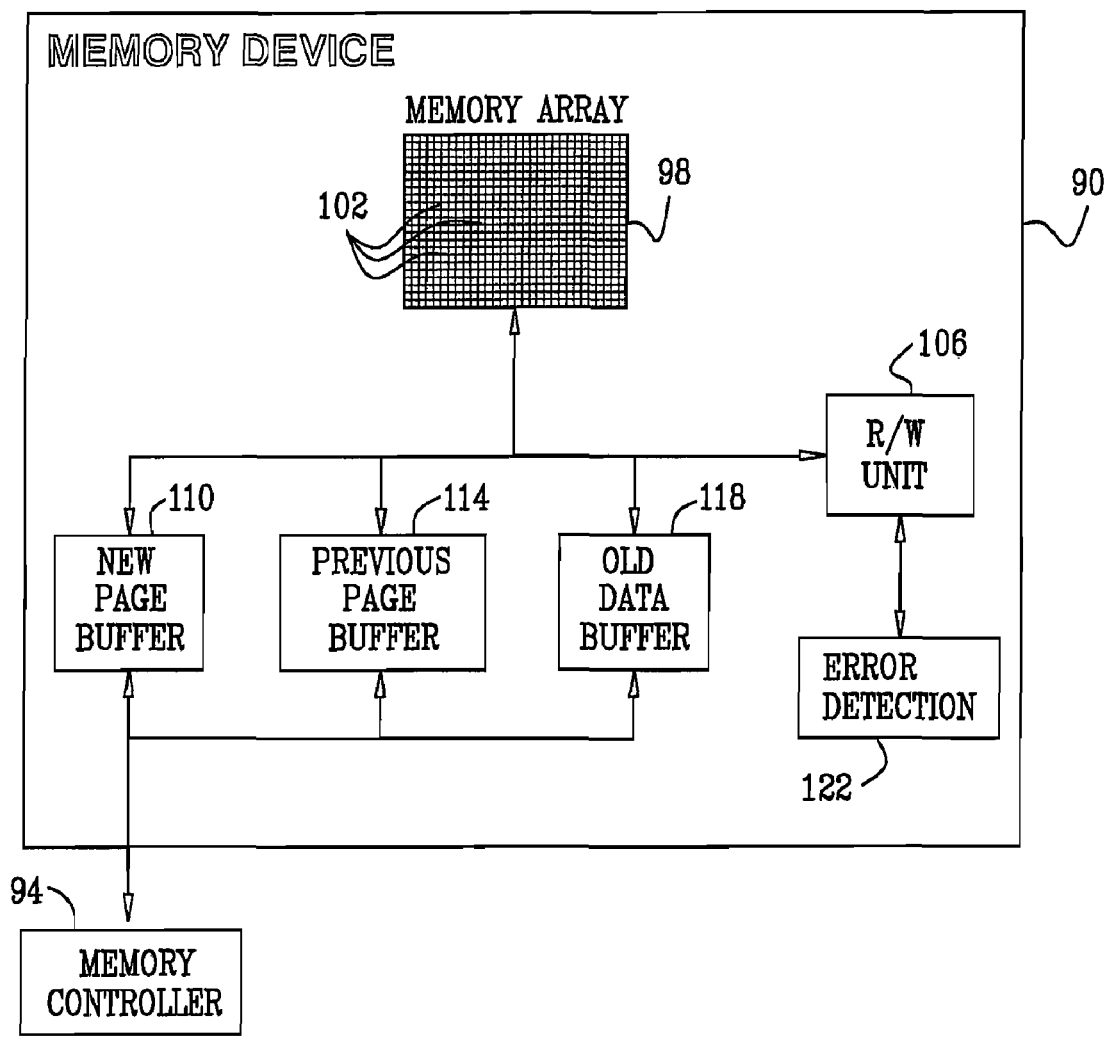

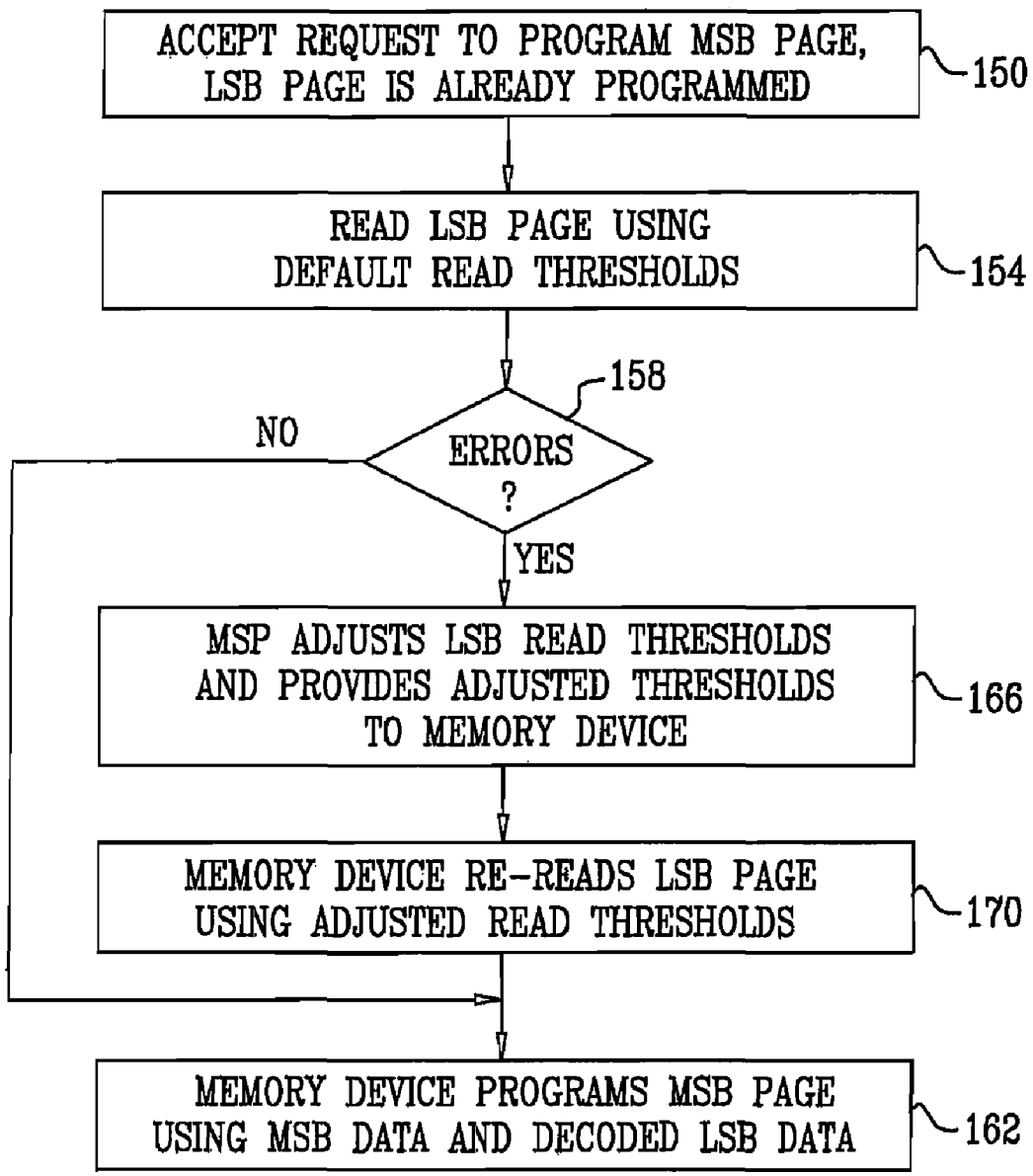

PROGRAMMING SCHEMES FOR MULTI-LEVEL ANALOG MEMORY CELLS

CROSS-REFERENCE TO RELATED APPLICATIONS

This application claims the benefit of U.S. Provisional Patent Application 60/954,169, filed Aug. 6, 2007, U.S. Provisional Patent Application 60/954,317, filed Aug. 7, 2007, U.S. Provisional Patent Application 60/970,058, filed Sep. 5, 2007 and U.S. Provisional Patent Application 60/985,236, filed Nov. 4, 2007, whose disclosures are incorporated herein by reference.

FIELD OF THE INVENTION

The present invention relates generally to memory devices, and particularly to methods and systems for programming multi-level analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. The storage value represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

Analog memory cells are often programmed using an iterative programming process that is commonly known as Program and verify (P&V). In a typical P&V process, a sequence of programming pulses is applied to a group of memory cells. The level of the programming pulses increases incrementally from pulse to pulse. The analog values programmed in the cells are read ("verified") after each pulse, and the iterations continue until the desired levels are reached.

Some programming processes vary the parameters of the P&V process during programming. For example, U.S. Pat. No. 7,002,843, whose disclosure is incorporated herein by reference, describes a non-volatile memory device that is programmed by first performing a coarse programming process and subsequently performing a fine programming process. The coarse/fine programming methodology is enhanced by using an efficient verification scheme that allows some non-volatile memory cells to be verified for the coarse programming process while other non-volatile memory cells are verified for the fine programming process.

As another example, U.S. Pat. No. 7,054,193, whose disclosure is incorporated herein by reference, describes write operations that simultaneously program multiple memory cells on the same word line in a Multi Bit Per Cell (MBPC) Flash memory. The write operations employ word line voltage variation, programming pulse width variation and data-dependent bit line and/or source line biasing to achieve uniform programming accuracy across a range of target threshold voltages.

U.S. Pat. No. 7,349,263, whose disclosure is incorporated herein by reference, describes nonvolatile memory devices, which support P&V operations that improve the threshold voltage distribution within programmed memory cells. The improvement is achieved by reducing a magnitude of the programming voltage steps and increasing a duration of the verify operations once at least one of the plurality of memory cells undergoing programming has been verified as a "passed" memory cell.

SUMMARY OF THE INVENTION

An embodiment of the present invention provides a method for data storage, including:

storing first data bits in a set of multi-bit analog memory cells at a first time by programming the memory cells to assume respective first programming levels;

storing second data bits in the set of memory cells at a second time that is later than the first time by programming the memory cells to assume respective second programming levels that depend on the first programming levels and on the second data bits; and selecting a storage strategy responsively to a difference between the first and second times, wherein the storage strategy is applied to at least one group of the data bits, selected from among the first data bits and the second data bits.

In some embodiments, selecting the storage strategy is performed at the first time following storage of the first data bits. In an embodiment, selecting the storage strategy includes drawing an inference with respect to the time difference based on a status of the memory cells following the storage of the first data bits. Drawing the inference may include detecting that the set of the memory cells is partially-programmed following the storage of the first data bits. In another embodiment, selecting the storage strategy is performed at the second time.

In some embodiments, the method includes reading from the memory cells at least one set of the stored data bits, selected from among the first data bits and the second data bits, wherein the storage strategy is applied in reading the at least one set of data bits. In an embodiment, selecting the storage strategy includes determining read thresholds to be used in reading the at least one set of data bits. In another embodiment, selecting the storage strategy includes selecting a decoding process for reading the at least one set of data bits.

In yet another embodiment, selecting the storage strategy includes modifying a programming parameter used in storing the at least one group of the data bits. In still another embodiment, storing the first and second data bits includes applying to the memory cells a sequence of programming pulses that incrementally increase by a step size, and selecting the storage strategy includes modifying the step size. In a disclosed embodiment, storing the first and second data bits includes encoding the at least one group of the data bits with an Error Correction Code (ECC), and selecting the storage strategy includes modifying a redundancy level of the ECC.

In an embodiment, programming the memory cells to assume the first and second programming levels includes writing to the cells predefined storage values that correspond to the respective programming levels and are separated from one another by predefined separations, and selecting the storage strategy includes modifying a separation between at least two programming levels selected from among the first and second programming levels. In another embodiment, selecting the storage strategy includes measuring the difference between the first and second times and comparing the measured difference to a threshold.

In yet another embodiment, storing the second data bits includes retrieving the stored first data bits from the memory cells, caching the retrieved first data bits in a buffer and computing the second programming levels based on the cached first data bits and the second data bits, and selecting the storage strategy includes correcting errors in the cached first data bits and re-writing the first data bits, after correction of the errors, to the buffer prior to computing the second programming levels.

In some embodiments, storing the second data bits includes retrieving the stored first data bits from the memory cells, caching the retrieved first data bits in a buffer and computing the second programming levels based on the cached first data bits and the second data bits, and selecting the storage strategy includes:

correcting errors in the cached first data bits to produce error-corrected bits;

re-retrieving the first data bits from the memory cells after storage of the second data bits; and selecting the storage strategy responsively to a discrepancy between the error-corrected bits and the re-retrieved first data bits.

In a disclosed embodiment, selecting the storage strategy includes:

retrieving at least part of the stored first data bits from the memory cells using one or more read thresholds;

processing the retrieved first data bits so as to modify the read thresholds;

re-retrieving the first data bits from the memory cells using the modified read thresholds; and computing the second programming levels responsively to the second data bits and the re-retrieved first data bits.

In an embodiment, processing the retrieved first data bits includes detecting errors in the retrieved first data bits and modifying the read thresholds responsively to the detected errors.

There is additionally provided, in accordance with an embodiment of the present invention, a method for data storage, including:

storing first data bits in a memory device, which includes a first set of multi-bit analog memory cells and a second set of digital memory cells, by programming the analog memory cells to assume respective first programming levels;

caching the first data bits in the digital memory cells;

accepting second data bits for storage in the first set of analog memory cells;

processing the accepted second data bits and the cached first data bits so as to compute respective second programming levels for the analog memory cells; and storing the second data bits in the first set of analog memory cells by programming the analog memory cells to assume the respective second programming levels.

In some embodiments, caching the first data bits includes evaluating a criterion with respect to the first data bits, and caching the first data bits only responsively to meeting the criterion.

In an embodiment, when the first data bits are not cached in the digital memory cells, the method includes retrieving the first data bits from the analog memory cells, correcting errors in the retrieved first data bits to produce error-corrected bits, and computing the second programming levels responsively to the second data bits and the error-corrected bits. In a disclosed embodiment, correcting the errors includes detecting the errors by error detection circuitry in the memory device and correcting the errors by error correction circuitry external to the memory device responsively to detecting the errors.

In another embodiment, storing the first data bits includes applying to the analog memory cells a first sequence of programming pulses that incrementally increase by a first step size, and storing the second data bits includes applying to the analog memory cells a second sequence of the programming pulses that incrementally increase by a second step size, smaller than the first step size.

There is also provided, in accordance with an embodiment of the present invention, apparatus for data storage, including:

programming circuitry, which is coupled to store first data bits in a set of multi-bit analog memory cells at a first time by programming the memory cells to assume respective first programming levels, and to store second data bits in the set of memory cells at a second time that is later than the first time by programming the memory cells to assume respective second programming levels that depend on the first programming levels and on the second data bits; and a processor, which is configured to select a storage strategy responsively to a difference between the first and second times, wherein the storage strategy is applied to at least one group of the data bits, selected from among the first data bits and the second data bits.

There is further provided, in accordance with an embodiment of the present invention, a memory device, including:

a first set of multi-bit analog memory cells;

a second set of digital memory cells; and control circuitry, which is coupled to store first data bits in the first set of analog memory cells by programming the analog memory cells to assume respective first programming levels, to cache the first data bits in the digital memory cells, to accept second data bits for storage in the first set of analog memory cells, to process the accepted second data bits and the cached first data bits so as to compute respective second programming levels for the analog memory cells, and to store the second data bits in the first set of analog memory cells by programming the analog memory cells to assume the respective second programming levels.

In some embodiments, the memory device includes a device package, and the analog memory cells, the digital memory cells and the control circuitry are packaged in the device package.

There is additionally provided, in accordance with an embodiment of the present invention, apparatus for data storage, including:

a memory including a set of multi-bit analog memory cells;

programming circuitry, which is coupled to store first data bits in the set of multi-bit analog memory cells at a first time by programming the memory cells to assume respective first programming levels, and to store second data bits in the set of memory cells at a second time that is later than the first time by programming the memory cells to assume respective second programming levels that depend on the first programming levels and on the second data bits; and a processor, which is configured to select a storage strategy responsively to a difference between the first and second times, wherein the storage strategy is applied to at least one group of the data bits, selected from among the first data bits and the second data bits.

The present invention will be more fully understood from the following detailed description of the embodiments thereof, taken together with the drawings in which:

BRIEF DESCRIPTION OF THE DRAWINGS

FIG. 1 is a block diagram that schematically illustrates a memory system, in accordance with an embodiment of the present invention;

FIG. 2 is a flow chart that schematically illustrates a method for storing data in an array of multi-level memory cells, in accordance with an embodiment of the present invention;

FIG. 3 is a block diagram that schematically illustrates a memory system, in accordance with an alternative embodiment of the present invention;

FIGS. 5 and 6 are flow charts that schematically illustrate methods for storing data in an array of multi-level memory cells, in accordance with embodiments of the present invention.

DETAILED DESCRIPTION OF EMBODIMENTS

Overview

Figure 4:
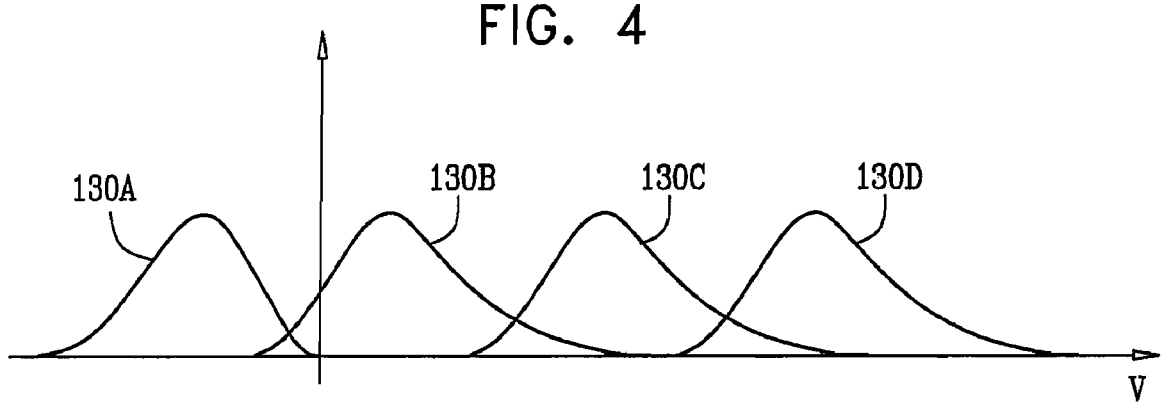
FIG. 4 is a graph showing threshold voltage distributions in a group of multi-level memory cells, in accordance with an embodiment of the present invention.

In many multi-level analog device configurations, different memory pages are stored in different, respective bits of a group of memory cells. For example, a group of eight-level cells may store three memory pages, one page mapped to each bit of the cells. When programming a second or higher page, the storage value to be written to a given cell depends on the new bit to be written and on the previous programming state of the cell (i.e., on bits from previous pages that were written to the cell). Thus, in some conventional programming schemes, a second or higher page is programmed by (1) reading the storage values from the cells, (2) reconstructing the data of the previously-written page or pages, and (3) computing new programming levels for the cells based on the data of the new page and on the reconstructed data of the previous pages.

The process of reading and reconstructing the data of previously-written pages inherently introduces some error probability. When a reconstruction error occurs in a given cell, the new programming level computed for this cell when programming the new page is likely to be erroneous, as well. The probability of erroneous data reconstruction during programming operations is particularly severe when a large time gap exists between programming of the new page and programming of the previous pages (since distortion in analog memory cells typically increases over time). Such scenarios are referred to herein as Discontinuous Programming (DP) scenarios. Nevertheless, programming schemes that rely on reconstruction of previously-written data inevitably involve some error probability, regardless of the time gap between the programming of different pages. Such programming schemes are often designed to program the cells with high accuracy and/or to leave large margins between adjacent programming levels, in order to account for potential reconstruction errors. These measures typically reduce the programming speed and/or storage capacity of the cells.

Embodiments of the present invention provide improved methods and systems for storing data in arrays of multi-level analog memory cells, such as MLC Flash memory devices. The methods and systems described herein efficiently mitigate errors that may occur during programming due to reconstruction of previously-written pages.

In some embodiments that are described hereinbelow, a Memory Signal Processor (MSP) stores data in a memory, which comprises an array of multi-level (multi-bit) analog memory cells. The MSP identifies DP scenarios, i.e., scenarios in which large time gaps separate the programming of different pages to a given group of cells. When identifying a DP scenario, the MSP selects an appropriate storage strategy in order to compensate for the potentially-higher error probability associated with the DP scenario. The MSP may identify DP scenarios when programming early-arriving pages (i.e., before the potentially-large time gap), when programming late-arriving pages (i.e., after the potentially-large time gap), or even when reading the cells. Various methods for detecting DP scenarios, as well as various storage strategies that may be selected and applied in response to detecting such scenarios, are described below. By detecting and acting upon DP scenarios, the nominal accuracy of programming the cells can be relaxed, and programming speed can be increased accordingly.

In some embodiments, when programming an array of multi-bit analog memory cells, data of some of the programmed pages is cached in digital memory (e.g., in page buffers) for later use. When writing a second or higher page to a group of cells, the new programming levels are computed based on the cached data of previously-written pages, without having to read the cells and reconstruct the data. Computing the new programming levels based on cached data enables programming the cells with reduced precision, since there is no need to account for possible reconstruction errors. As a result, programming speed can be increased considerably.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory cell array comprises multiple analog memory cells 32. In the context of the present patent application and in the claims, the term "analog memory cell" is used to describe any memory cell that holds a continuous, analog value of a physical parameter, such as an electrical voltage or charge. Array 32 may comprise analog memory cells of any kind, such as, for example, NAND, NOR and CTF Flash cells, PCM, NROM, FRAM, MRAM and DRAM cells. Memory cells 32 comprise Multi-Level Cells (MLC, also referred to as multi-bit cells), each storing multiple data bits.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values to the cell.

Memory device 24 comprises a reading/writing (R/W) unit 36, which converts data for storage in the memory device to storage values and writes them into memory cells 32. In alternative embodiments, the R/W unit does not perform the conversion, but is provided with voltage samples, i.e., with the storage values for storage in the cells. The R/W unit typically (although not necessarily) programs the cells using an iterative Program and Verify (P&V) process, as is known in the art. When reading data out of array 28, R/W unit 36 converts the storage values of memory cells 32 into digital samples having a resolution of one or more bits. Data is typically written to and read from the memory cells in groups that are referred to as pages. Memory device 24 comprises one or more page buffers 38, which are used for caching data pages during data storage and retrieval.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In some embodiments, unit 48 produces the storage values for storing in the memory cells and provides these values to R/W unit 36. Alternatively, unit 48 provides the data for storage, and the conversion to storage values is carried out by the R/W unit internally to the memory device.

In some embodiments, the data that is stored in device 24 is encoded with an Error Correction Code (ECC). For this purpose, MSP 40 comprises an ECC encoding/decoding unit 52. Unit 52 encodes the data prior to its storage in the memory cells, and decodes the encoded data retrieved from the memory.

MSP 40 communicates with a host 56, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and MSP may be integrated on separate semiconductor dies in a single Multi-Chip Package (MCP) or System on Chip (SoC). Further alternatively, some or all of the MSP circuitry may reside on the same die on which the memory array is disposed. Further alternatively, some or all of the functionality of MSP 40 can be implemented in software and carried out by a processor or other element of the host system, or by a suitable memory controller. In some implementations, a single MSP 40 may be connected to multiple memory devices 24. In yet another embodiment, some or all of the MSP functionality may be carried out by a separate unit, referred to as a memory extension, which acts as a slave of memory device 24.

Memory cells 32 of array 28 are typically arranged in a grid having multiple rows and columns, commonly referred to as word lines and bit lines, respectively. The array is typically divided into multiple pages, i.e., groups of memory cells that are programmed and read simultaneously. In some embodiments, each page comprises an entire row of the array. In alternative embodiments, each row (word line) can be divided into two or more pages (e.g., one page stored in the even-order cells of the word line and another page stored in the odd-order cells of the word line). Cells are typically erased in groups of word lines that are referred to as erasure blocks.

Data Storage in Multi-Bit Analog Memory Cells

In an N bits/cell memory, data is typically stored by programming each memory cell to one of $2^N$ predefined programming levels, with each level representing a possible combination of values of the N bits. For example, a four-level (2 bits/cell) memory may use four programming levels that represent {11}, {01}, {00} and {10} bit values, such as the levels shown in the following table:

| Programming level | Bit values | | Nominal threshold voltage (V) |
|---|---|---|---|
| | MSB | LSB | |
| L0 | 1 | 1 | −1 |
| L1 | 0 | 1 | 1 |
| L2 | 0 | 0 | 3 |
| L3 | 1 | 0 | 5 |

One of the two bits of each cell is referred to as a Least Significant Bit (LSB) and the other bit is referred to as a Most Significant Bit (MSB). (Terms such as LSB and MSB are used merely as a way to refer to specific bits of the multi-bit memory cells, and do not imply that certain bits are more significant or important than others. Alternatively, any other suitable terminology can be used for referring to the individual bits stored in the cells.) Similar schemes can be defined for other types of multi-bit cells storing higher numbers of bits, such as eight-level cells storing 3 bits/cell or sixteen-level cells storing 4 bits/cell.

In some system configurations, the memory cells along a given word line (row) of the array store multiple memory pages. In a typical implementation, different bits are mapped to different pages. For example, in a given word line of a 2 bits/cell memory, a certain memory page may be stored in the LSBs of the cells and another page may be stored in the MSBs. In the description that follows, such pages are referred to as LSB pages and MSB pages for brevity. Similarly, in a 3 bits/cell device, the cells along a given word line may store three memory pages, referred to as an LSB page, a Central Significance Bit (CSB) page and an MSB page.

As can be appreciated, writing the MSB of a certain memory cell depends on the value of the LSB that was already written to the cell. Consider, for example, the table above. In order to program the MSB to "0", the cell is to be programmed to level L1 if the LSB is "1", and to level L2 if the LSB is "0". In many practical scenarios, however, the previously-written data may not be available when programming subsequent pages. For example, the MSB page of a given word line may be written weeks, months or even years after the LSB page of this word line was written.

Therefore, in many system configurations, programming a second (or higher) page is performed by:
  Reading the storage values from the memory cells.
  Reconstructing the current programming levels of the cells (i.e., reconstructing the data of the previously-written page or pages), such as by comparing the read storage values to one or more read thresholds. The reconstructed data is cached in page buffers 38.
  Computing new programming levels for the cells based on the new data page to be written and on the reconstructed data cached in the page buffers.
  Programming the memory cells to assume the new programming levels.

As noted above, writing a second (or higher) page to a group of multi-bit memory cells often comprises determining the current programming levels of the cells (i.e., reconstructing the data of previously-written pages). In many practical cases, however, the storage values read from the cells are distorted due to various distortion mechanisms, such as cross-coupling interference from neighboring cells, voltage drift due to aging, disturb noise from operations performed on other cells, and many others. Because of these distortion effects, reconstruction of the previously-written data has a certain error probability, i.e., a probability of erroneously determining the programming levels of the cells from the read storage values. When data reconstruction of the previously-written data of a given cell is erroneous, the programming of new data to the cell is likely to be erroneous, as well.

Discontinuous Programming of Multi-Bit Analog Memory Cells

The severity of distortion effects often depends on the time that passed since the cells were programmed. For example, storage values may drift over time due to charge loss. Neighboring memory cells may be programmed after the interfered cells and cause additional interference. Disturb noise may also accumulate over time due to operations applied to other cells in the array. Therefore, the probability of erroneous reconstruction of previously-written pages often increases with the time difference between the programming of these previous pages and the programming of the new page.

In view of this dependence, embodiments of the present invention provide improved methods and systems for storing data in multi-bit analog memory cells. As will be explained below, MSP 40 of system 20 identifies scenarios in which different bits of a given group of multi-bit cells are programmed (or expected to be programmed) at large time differences. These scenarios are referred to herein as Discontinuous Programming (DP) scenarios. When the MSP detects a DP scenario that is expected to cause potential errors, it selects an appropriate storage strategy in order to reduce or prevent these errors.

The term "storage strategy" refers to any action, process, parameter value or decision logic that applies to the programming and/or retrieval of data in the analog memory cells. Several exemplary storage strategies are described below.

In some embodiments, the MSP selects the strategy by modifying certain programming parameters that are used for programming the cells, so as to reduce the error probability caused by the large time gap between programming of the different bits. Various programming parameters can be modified by the MSP in order to improve performance in a given DP scenario. For example, when the cells are programmed using a Program and Verify (P&V) process, as is known in the art, the MSP may modify the programming step size (i.e., the difference between the magnitudes of successive programming pulses) used for programming the cells. Reducing the P&V programming step size improves programming accuracy (and therefore improves resilience to distortion) at the expense of higher programming time, and vice versa. Thus, if a DP scenario is detected, the MSP may program the current and/or new page with a reduced P&V step size in order to account for the potentially-higher error probability. Additionally or alternatively, other suitable P&V parameters can also be modified.

As another example, when the stored data is encoded with an Error Correcting Code (ECC), the MSP may increase the amount of redundancy (e.g., increase the ECC code rate) in response to detecting a DP scenario. As yet another example, the MSP may increase the voltage separation between adjacent programming levels to reduce the error probability. Further additionally or alternatively, any other suitable programming parameter can be modified.

Typically, programming parameters that reduce the error probability cause some kind of performance degradation (e.g., increase the programming time, reduce the storage capacity of the cells or extend the voltage window). This performance degradation is usually tolerable, since DP scenarios are relatively rare.

FIG. 2 is a flow chart that schematically illustrates a method for storing data in array 28 of multi-level memory cells 32, in accordance with an embodiment of the present invention. The present example addresses a configuration in which cells 32 comprise N bits/cell MLC, with each bit corresponding to a different page. Thus, a group of memory cells along a certain word line stores up to N memory pages, which can be written together or separately at any given time.

The method begins with MSP 40 accepting data for storage in the first M pages mapped to the cell group (M<N), at a first input step 60. As explained above, the first M pages are to be written to the M least significant bits of the cells. The MSP, using R/W unit 36 of memory device 24, writes the first M pages to the memory cells, at a first programming step 64. The MSP instructs (or otherwise causes) the R/W unit to program the M least significant bits of the cells using a certain default P&V step size.

At a later time, the MSP accepts additional data for storage in one or more of the remaining N−M pages of the same group of memory cells, at a second input step 68. The MSP determines the time that elapsed since programming of the first M pages (M least significant bits of the cells), at a time gap measurement step 72. The MSP checks whether the time gap is sufficiently long to be regarded as a Discontinuous Programming (DP) scenario, at a gap checking step 76. For example, the MSP may compare the time gap to a predetermined threshold.

If the time gap is considered tolerable, i.e., sufficiently short, the MSP programs the remaining pages using certain default storage strategy (in the present example, using default programming parameters), at a continuous programming step 80. If, on the other hand, the time gap is regarded as a DP scenario (i.e., if an excessively long time passed since the first M pages were programmed), the MSP programs the later-arriving pages using a modified storage strategy (in this example, using modified programming parameters) designed to reduce the expected error probability, at a discontinuous programming step 84. For example, the MSP may control the R/W unit to apply a smaller P&V step size and/or apply higher ECC redundancy, in comparison with the default parameter values.

In the description above, the MSP detects a DP situation when programming the cells, and uses a modified strategy for programming the later-arriving (higher) pages. This scheme, however, was chosen purely by way of example. In general, the MSP may detect and act upon DP scenarios (or expected DP scenarios) when writing the earlier-arriving pages, when writing the later-arriving pages, and/or when retrieving the data from the memory cells.

In some embodiments, the MSP detects DP scenarios when programming (or intending to program) the M early-arriving pages written to the cells. For example, the MSP may accept a certain data item (e.g., a file) for storage, and determine that storing the data item will not fully program the group of cells in question. In other words, the MSP may conclude that after storing the data item in the first M bits of the cells, one or more pages (bits) of the group of cells will remain non-programmed. Since it is usually unknown when the remaining pages will be written, the MSP infers that the time gap is expected to be large, and therefore regards this situation as a potential DP scenario. In order to reduce the error probability that may be caused by the potential DP scenario, the MSP may program one or more of the M early-arriving pages using modified programming parameters (e.g., using a small P&V step size or high ECC redundancy).

Additionally or alternatively, the MSP may detect DP scenarios when programming (or intending to program) the later-arriving pages, a certain period of time after programming of the early-arriving pages. For example, the MSP may detect that a certain page is about to be programmed to a group of cells that were already partially-programmed a long time ago. In some embodiments, the MSP may maintain a list of the last X pages that were programmed during the past T seconds. Using this list, the MSP can determine whether a page that is about to be programmed is written to a group of cells that was partially-programmed more than T seconds ago. In some embodiments, if the MSP power supply is turned off temporarily, when power returns the MSP empties the list and regards all pages as potential DP scenarios. In some applications (e.g., in digital cameras), the power supply is typically turned on for only short periods of time. In such applications, the MSP typically applies a discontinuous programming strategy only if the cells have been partially programmed before power was turned on.

Upon detecting a possible DP scenario when programming a later-arriving page, the MSP may apply various storage strategies to reduce the high error probability that may be caused by this scenario.

For example, the MSP may improve the reliability of the data that was previously stored in the first M least significant bits of the cells. In some embodiments, the MSP improves the reliability of this data before computing the new programming levels by:

Reading the M initially-programmed pages (i.e., reading the storage values stored in the first M least significant bits of the cells), and caching the read data bits in page buffers 38 of the memory device.

Applying ECC decoding to the cached data.

Writing the data, after error correction, back into page buffers 38 of the memory device.

Using this process, the new programming levels will be computed based on error-corrected data, and the probability of error is therefore considerably reduced. In some system configurations, the MSP writes only the bits that were corrected by the ECC decoding process back into the page buffers, in order to reduce the data traffic between the MSP and the memory device, and thus reduce the programming time. This technique is particularly suitable for memory devices that support partial (selective) external programming of the page buffers.

In alternative embodiments, such as when the memory device does not support partial programming of the page buffers, the MSP may improve the reliability of the M previously-stored pages by applying the following strategy:

Reading the M initially-programmed pages, and caching the read data bits in page buffers 38.

Applying ECC decoding to the cached data, possibly in parallel to programming of the later-arriving pages.

Re-reading the first M pages from the cells after programming of the later-arriving pages is completed.

comparing the re-read pages to the results of the ECC-corrected data.

Taking recovery measures if detecting large discrepancies between the ECC-corrected data and the re-read data. Recovery measures may comprise, for example, copying some or all of the M pages to another block, re-programming some or all of the M pages or increasing ECC redundancy in these pages.

In accordance with another possible strategy, the MSP may improve the reliability of the first M pages by further optimizing read parameters that will be used for reading these pages. For example, the MSP may adjust the read thresholds used for reading the storage values from the pages. Additionally or alternatively, the MSP may modify parameters such as the read bias voltage.

Additionally or alternatively, when the MSP detects a possible DP scenario when programming the later-arriving page or pages, it may reduce the potentially-high error probability by modifying the programming parameters used for programming the later-arriving page or pages. The MSP may modify any of the programming parameters described above, such as reducing the P&V programming step size, increasing the ECC redundancy or increasing the separation between programming levels.

In some embodiments, the MSP detects and acts upon DP scenarios when reading the cells. In other words, the storage strategy may apply to reading the cells. For example, the MSP may identify a possible DP scenario by detecting that the first page of a retrieved data item is not read from the LSBs of the cells, but from a higher-significance page. In such a situation, the low-significance pages stored in the cells are likely to belong to another data item, which may have been stored a long time before the presently-retrieved data item was stored.

In alternative embodiments, the MSP may store indications of possible DP scenarios when programming the cells, and act upon the stored indications when reading the cells. Any of the methods for identifying possible DP scenarios explained above can be used for this purpose. The DP indication of a given page may comprise a Boolean flag that indicates whether or not DP is suspected with respect to this page. The Boolean flags may be stored in one or more of cells 32. Alternatively, any other suitable technique can be used.

The MSP may select and apply various strategies in response to a suspected DP scenario when reading the cells. For example, the MSP may invoke a reading process having higher performance in comparison with the default reading process used for reading the cells. The higher-performance reading process may comprise, for example, computing soft metrics for decoding the ECC of these pages, estimating and canceling cross-coupling interference or other distortion in the pages, adjusting the read thresholds used for reading the pages, or any other suitable technique. Some of these processes involve re-reading the pages in question multiple times and combining the read results.

Techniques of this sort are described, for example, in PCT Application WO 2007/132453, entitled "Distortion Estimation and Cancellation in Memory Devices," filed May 10, 2007, PCT Application PCT/IL2007/001059, entitled "Estimation of Non-Linear Distortion in Memory Devices," filed Aug. 27, 2007, PCT Application WO 2007/132457, entitled "Combined Distortion Estimation and Error Correction Coding for Memory Devices," filed May 10, 2007, and U.S. patent application Ser. No. 11/995,814, entitled "Reading Memory Cells using Multiple Thresholds," filed Jan. 15, 2008, whose disclosures are incorporated herein by reference. An example method in which the MSP adjusts the read thresholds based on detected errors is described in FIG. 6 further below.

Programming MLC Bits Using Cached Previously-Programmed Bits

As explained above, the process of programming higher-significance bits of multi-bit memory cells by reading and reconstructing the data stored in lower-significance bits inevitably involves some error probability, which may cause programming errors. Although this effect may be more severe when programming is discontinuous (when long time intervals separate the programming of different bits), it exists to some degree regardless of the time that elapsed between programming of different bits.

Some embodiments of the present invention provide improved methods and systems for programming multi-bit memory cells. In accordance with these methods and systems, data pages that are written to a group of multi-bit analog memory cells are cached in digital memory for later use. When programming the higher-significance bits of the cell group, the new programming levels are computed based on the newly-arriving data that is intended for storage in the higher-significance bits and on the cached data of the lower-significance bits. Since these techniques do not read and reconstruct the lower-significance bits from the storage values stored in the analog memory cells, but rather use the digitally-cached data, they are not sensitive to read errors. These techniques usually increase programming speed, since reading the digitally-cached data is generally faster than reading the analog memory cells.

FIG. 3 is a block diagram that schematically illustrates a memory system, which comprises a memory device 90 that is controlled by a memory controller 94, in accordance with an alternative embodiment of the present invention. Memory device 90 comprises an array 98 of multi-bit (multi-level) analog memory cells 102, similar to array 28 of memory cells 32 in FIG. 1 above. Memory device 90 comprises a R/W unit 106, which is similar to R/W unit 36 of FIG. 1. Additionally, R/W unit 106 carries out various control functions that are described below. Thus, R/W unit 106 can be viewed as control circuitry of the memory device. The functionality of memory controller 94 may be carried out by any suitable processor, such as by an MSP or by a processor of the host system.

In some embodiments, MSP 40 in FIG. 1 and memory controller 94 in FIG. 3 comprise general-purpose processors, which are programmed in software to carry out the functions described herein. The software may be downloaded to the processors in electronic form, over a network, for example, or it may, alternatively or additionally, be provided and/or stored on tangible media, such as magnetic, optical, or electronic memory. Alternatively, some or all functions of MSP 40 and/or of controller 94 may be implemented in hardware of firmware.

Data that is written to array 98 is cached in three types of page buffers, namely a new page buffer 110, a previous page buffer 114 and an old data buffer 118. Each of buffers 110, 114 and 118 may store the data of one or more memory pages. Unlike analog memory cells 102, the page buffers (buffers 110, 114 and 118) comprise digital memory cells. In the context of the present patent application and in the claims, terms such as "digital memory" and "digital memory cell" refer to any type of memory that stores data by assuming a set of discrete states rather than a continuous range of analog values. Digital memory cells may comprise, for example, Static Random Access Memory (SRAM) cells, flip-flops or any other suitable type of digital cells. The digital memory cells typically comprise volatile memory.

New page buffer 110 holds the data of a memory page that is currently intended for writing to a given group of cells 102. The data stored in buffer 110 is typically provided by memory controller 94. Previous page buffer 114 holds the data of one or more pages that were previously written to the same group of cells into which the page stored in buffer 110 is to be written old data buffer 118 stores the data of various pages that were written in the past in array 98. R/W unit 106 may copy the data stored in the new page buffer to the previous page buffer and/or to the old data buffer.

Typically although not necessarily, array 98 of analog memory cells 102, digital page buffers 110, 114 and 118, and R/W unit 106 are packaged in a single device package.

In a typical flow, memory controller 94 requests memory device 90 (e.g., using the well-known NAND interface) to store a certain memory page in array 98. If the page is intended for storage in a group of memory cells whose lower-significant bits are already programmed, the R/W unit calculates the new programming levels of these cells based on (1) the data of the new page received from the memory controller and (2) the data of the pages that were previously-stored in the group of cells and cached in buffers 114 or 118. In some embodiments, the R/W unit computes the new programming levels based on the data cached in previous page buffer 114. If necessary, the R/W unit copies the appropriate page or pages from old data buffer 118 to buffer 114 before performing the computation.

As can be appreciated, caching all or even most of the pages in buffer 118 is usually not feasible. In a typical implementation, only a small fraction of the data of the pages stored in array 98 can be cached in buffer 118. In some embodiments, the memory controller selects which pages are to be cached in old data buffer 118 in accordance with certain predefined criteria. For example, the controller may cache pages whose distortion level is high, pages whose data is particularly sensitive, pages whose desired retention time is high, or pages that meet any other suitable criterion.

Pages that do not meet the predefined criteria are not cached in the old data buffer. When programming a given page, if the previous pages written to the same cell group are not available in buffer 118, they are read from array 98 in spite of the possibility of read errors. In some embodiments, some or all of the pages that are not cached in buffer 118 can be error-corrected by the memory controller, so as to reduce the likelihood of read errors. In such configurations, memory controller 94 is able to read and/or modify the data cached in previous page buffer 114. Using this functionality, the memory controller may process the data cached in buffer 114, such as apply error detection and/or correction to the cached data. If the memory controller modifies the data (e.g., corrects errors), it may store the modified data directly in buffer 114 without first caching it in buffer 110.

In some embodiments, device 90 further comprises an error detection unit 122, which is able to detect errors in the data that is cached in previous page buffer 114. For example, each page may be encoded with Cyclic Redundancy Check (CRC) bits, checksum bits or any other suitable type of Error Detection Code (EDC). Unit 122 decodes the EDC so as to identify the presence of errors in the data. In some embodiments, when the data is encoded with an ECC, unit 122 may comprise a reduced-complexity ECC decoder that is able to detect the presence of errors but not correct them. In such cases, the ECC is regarded as a type of error detection code.

In a possible flow, when writing a new page to a given group of cells, the R/W unit first checks whether the previous pages written to this cell group are available in buffer 118. If available, the R/W unit copies the previous pages to buffer 114 and computes the new programming levels based on the data of the new page cached in buffer 110 and on the data of the previous pages cached in buffer 114. If the data of the previous pages is not available in buffer 118, the R/W unit reads the previous pages from the analog cells, reconstructs the data of these pages and caches it in buffer 114. The memory controller retrieves the data cached in buffer 114, applies error correction and re-writes the error-corrected data to the buffer. Then, the R/W unit computes the new programming levels based on the new data in buffer 110 and on the error-corrected data of previous pages cached in buffer 114. This process considerably reduces the probability of error in computing the new programming levels.

The memory device configuration shown in FIG. 3 is an exemplary configuration, which is shown purely for the sake of conceptual clarity. In alternative embodiments, any other memory device configuration that allows (1) caching of previously-stored pages in digital memory and (2) use of cached pages in programming subsequent pages can also be used.

Since the process described above considerably reduces the probability of programming errors, the R/W may program the low-significance pages of the cells less accurately (e.g., using a large P&V step size) in comparison with conventional methods that read the previous pages from the cells. The use of large P&V step size increases the programming speed considerably.

For example, consider a group of 3 bits/cell memory cells, in which three data pages (LSB, CSB and MSB pages) can be stored. If the data of the LSB and CSB pages is cached in digital memory, then a larger error probability can be tolerated for these pages, since subsequent programming of the MSB page will be carried out using the cached data without reading the cells. Thus, the LSB and CSB pages can be programmed rapidly using a large P&V step size. In some embodiments, the LSB and MSB pages can be programmed so that the threshold voltage distributions of adjacent programming levels overlap one another. This is in contrast to conventional configurations, in which a certain voltage margin is maintained between adjacent programming levels.

FIG. 4 is a graph showing threshold voltage distributions in a group of multi-level memory cells, in accordance with an embodiment of the present invention. FIG. 4 shows an exemplary scenario, in which the first two pages have been programmed into a group of 3 bits/cell memory cells with reduced accuracy (large P&V step size), as in the above example. The figure shows four threshold voltage distributions 130A . . . 130D, corresponding to four programming levels that store the LSB and CSB pages. As can be seen in the figure, the voltage distributions are relatively wide because of the large P&V step size, and adjacent programming levels overlap one another.

Figure 5:
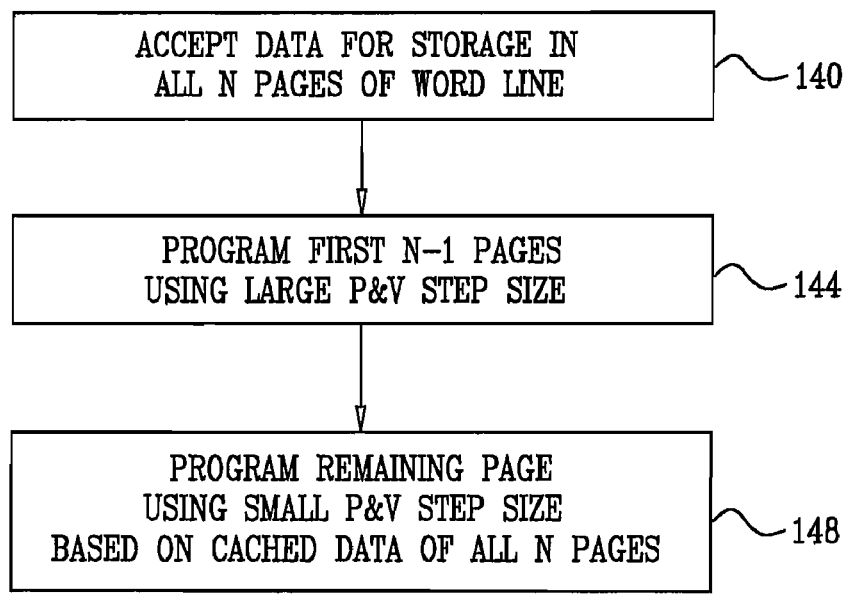

FIG. 5 is a flow chart that schematically illustrates a method for storing data in array 98 of N bits/cell analog memory cells 102, in accordance with another embodiment of the present invention. In this embodiment, the cells along each word line store N pages, and there is no distinction between odd-order and even-order bit lines. However, the method of FIG. 5 can be generalized to odd/even configurations in a straightforward manner.

The method begins with memory controller 94 accepting a data item (e.g., a file) for storage in array 98 at an input step 140. The memory controller concludes that the data item will occupy all N pages of a given word line. The memory controller typically determines the number of bits to be programmed to each cell based on the total number of pages to be stored, in accordance with the mapping of pages to word lines that is used in the particular memory device.

The memory controller may determine the total number of pages using various means. For example, in some embodiments the memory controller carries out the file system functionality that specifies the required size. In other embodiments, the memory controller may carry out a Logical Block Addressing (LBA) or Block Abstracted (BA) interface, as is known in the art, in which the host system issues a program command with a large number of sectors, ending up with a large number of pages. As another example, the host system may issue to the memory controller a dedicated command or signal indicating the start and size of the data item. As yet another example, the memory controller may support a dedicated programming command for programming multiple pages.

Upon determining that the data item will occupy all N pages, the memory controller (using R/w unit 106) programs the first N−1 pages rapidly using a large P&V step size, at a first programming step 144. The memory device caches the data of the first N−1 pages in buffer 114, as explained above. The memory controller (using R/W unit 106) then programs the $N^{th}$ page using a P&V step size that is smaller than the step size used for programming the first N−1 pages, at a second programming step 148. In order to program the $N^{th}$ page, unit 106 computes the new programming levels of the cells using the data of the $N^{th}$ page (cached in buffer 110) and of the data of the first N−1 pages (cached in buffer 114).

Typically, the memory controller acknowledges to the host system that the programming is completed only after all N pages have been programmed successfully. In some embodiments, the memory controller may use modified programming parameters (e.g., higher ECC redundancy, as described in FIG. 2 above) when programming the first N−1 pages, in order to compensate for the possibly-higher error probability that may be caused by the larger P&V step size.

The description above referred to a programming operation that programs all N pages of a given word line. However, the method of FIG. 5 can be used in any scenario in which the memory controller identifies that a programming task would program M pages out of the N possible pages, M≦N. Upon identifying such a scenario, the memory controller programs the first M−1 pages rapidly with a large P&V step size, and the $M^{th}$ page with a smaller step size, using the cached data of the previous pages.

Reliable Programming Using Read Threshold Adjustment

As explained above, in many data storage schemes, programming a second or higher page in a group of cells typically involves reading and reconstructing the data of the previously-written page or pages, and then computing new programming levels for the cells based on the data of the new page and on the reconstructed data of the previous pages. In these schemes, read errors in reading the previously-written page or pages may lead to errors in programming the new page.

In some embodiments, the MSP reduces the probability of read errors in reading the previously-written pages by adjusting the read thresholds that are used by the memory device to read these pages. In many cases, the MSP is in a better position than the memory device to carry out this adjustment, since it can apply various signal processing techniques (e.g., error detection and correction) for determining the optimal read threshold values.

FIG. 6 is a flow chart that schematically illustrates a method for storing data in an array of analog memory cells, in accordance with another embodiment of the present invention. The present example refers to programming of an LSB page and an MSB page in a group of 2 bits/cell analog memory cells. The method can be used, however, with multi-level memory cells storing any desired number of bits.

The method begins with the MSP accepting a request to program the MSB page of a group of cells, at a programming request step 150. The data to be programmed in the MSB page is provided in or with the request. The LSB page of the group of cells in question is assumed to be already programmed. In response to the request, the MSP instructs the memory device to read the LSB page. The memory device reads the LSB page using a default set of read thresholds, at an LSB reading step 154. The memory device sends the data read from the LSB page to the MSP.

The MSP checks whether the read LSB data contains errors, at an error checking step 158. The MSP may apply any suitable error detection or correction technique for this purpose. If the MSP does not find errors in the read LSB data, it instructs the memory device to proceed and program the MBS page. The memory device programs the MSB page, at an MSB programming step 162. The memory device computes the programming levels for programming the cells based on (1) the MSB data provided at step 150 above, and (2) the LSB data read at step 154 above.

If, on the other hand, the MSP finds that the LSB data read at step 154 does contain errors, the MSP adjusts the read thresholds used for reading the LSB page, at a threshold adjustment step 166. The MSP may use any suitable technique for adjusting the LSB read thresholds based on the detected errors. For example, for each corrected error event, the MSP may determine the programming level that was initially programmed and the (different) programming level that was actually decoded. The MSP may compute the threshold adjustments based on the intended and actual programming levels. Generally, however, the MSP may adjust the read thresholds based on both corrected and uncorrected errors.

The MSP provides the adjusted LSB read thresholds to the memory device. The memory device retreads the LSB page using the adjusted read thresholds, at an LSB re-reading step 170. The re-read operation is typically internal to the memory device, and the memory device does not report the re-read results to the MSP. Because of the optimized threshold values, the LSB data read at step 170 will typically have no errors, or at least fewer errors in comparison with the data read at step 154.

Having now obtained error-reduced LSB data, the memory device programs the MSB page using the re-read LSB data (re-read at step 170) and the MSB data (accepted at step 150), at MSB programming step 162. Since the re-read LSB data was read using the adjusted threshold and has little or no errors, the MSB programming has a reduced number of errors, as well.

In some embodiments, the memory device uses different sets of read thresholds for different scenarios of programmed and non-programmed pages. For example, the memory device may use a certain set of read thresholds when only the LSB page is programmed, and another set of thresholds when both LSB and MSB pages are programmed. Typically, the MSP is capable of setting the different sets of read thresholds used by the memory device. The MSP is typically able to set the read thresholds for both external read operations (in which the memory device reports the read data to the MSP) and internal read operations (in which the read data is used only internally to the memory device and are not reported to the MSP).

In some embodiments, the MSP may re-read the LSB page and re-adjust the read thresholds iteratively, e.g., until converging to satisfactory error performance.

The method of FIG. 6 can be generalized in a straightforward manner to memory cells storing any desired number of bits. At each stage, the MSP adjusts the read thresholds of the lowest M pages, and then programs the $(M+1)^{th}$ page using the error-reduced data read from the previous M pages.

The additional re-read operations carried out in the method of FIG. 6 may reduce the programming speed of the system. However, when the different pages of the group of cells are programmed substantially at the same time (e.g., sequentially), the MSP can avoid the extra re-read operations, since the storage values of the cells are not likely to drift considerably between the programming of the pages. Therefore, on average, the number of extra re-read operations is relatively rare, and the programming speed of the system will not be degraded significantly. Thus, in some embodiments, the MSP reverts to the method of FIG. 6 upon detecting a Discontinuous Programming (DP) scenario.

In some embodiments, the MSP reads the previously-programmed pages from a group of cells before programming an additional page, in order to backup these pages against power failure or unexpected reset that may occur during the programming of the additional page. This sort of backup is especially important when the pages are not written sequentially to the cell group. These scenarios are also the typical scenarios in which the MSP re-reads the previously-programmed pages as part of the method of FIG. 6. Therefore, the extra re-read operations cause little or no degradation in programming speed.

The description of FIG. 6 above referred to adjusting the LSB read thresholds based on detected errors. In alternative embodiments, however, the MSP may apply various other signal processing methods to the LSB read results in order to adjust the read thresholds. Any suitable process can be used for this purpose. For example, PCT Application PCT/IL2008/000329, entitled "Adaptive Estimation of Memory Cell Read Thresholds," filed Mar. 11, 2008, whose disclosure is incorporated herein by reference, describes several threshold adjustment methods in which the MSP estimates the Cumulative Distribution Function (CDF) of the storage values of the memory cells, and adjusts the read thresholds based on the estimated CDF.

In a typical flow, the memory device reads the LSB page using a certain set of read thresholds and sends the read results to the MSP. The MSP adjusts the read thresholds based on the read results, and updates the memory device with the adjusted threshold values. The memory device then re-reads the LSB page using the adjusted thresholds, and then computes the programming levels for programming the MSB page based on the re-read LSB data and the data to be programmed in the MSB page.

In some embodiments, the MSP can adjust the read thresholds using only part of the LSB read results. In these embodiments, the memory device may initially read only part of the LSB page (or transfer only part of the LSB read results to the MSP), thus reducing the degradation in programming speed.

Although the embodiments described herein mainly address data storage and retrieval in solid-state memory devices, the principles of the present invention can also be used for storing and retrieving data in Hard Disk Drives (HDD) and other data storage media and devices.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
predefining a continuous-programming storage strategy and a discontinuous-programming storage strategy for storage of data in multi-bit analog memory cells;
storing first data bits in a set of the multi-bit analog memory cells at a first time by programming the memory cells to assume respective first programming levels;
storing second data bits in the set of memory cells at a second time that is later than the first time by programming the memory cells to assume respective second programming levels that depend on the first programming levels and on the second data bits;
estimating a time difference that elapsed between the first time and the second time; and
selecting a storage strategy, by choosing the continuous-programming storage strategy when the time difference is below a predefined time threshold and choosing the discontinuous-programming storage strategy when the time difference is above the predefined time threshold, wherein the selected storage strategy is applied to at least one group of the data bits, selected from among the first data bits and the second data bits.

2. The method according to claim 1, wherein selecting the storage strategy is performed at the first time following storage of the first data bits.

3. The method according to claim 2, wherein selecting the storage strategy comprises drawing an inference with respect to the time difference based on a status of the memory cells following the storage of the first data bits.

4. The method according to claim 3, wherein drawing the inference comprises detecting that the set of the memory cells is partially-programmed following the storage of the first data bits.

5. The method according to claim 1, wherein selecting the storage strategy is performed at the second time.

6. The method according to claim 1, and comprising reading from the memory cells at least one set of the stored data bits, selected from among the first data bits and the second data bits, wherein the storage strategy is applied in reading the at least one set of data bits.

7. The method according to claim 6, wherein selecting the storage strategy comprises determining read thresholds to be used in reading the at least one set of data bits.

8. The method according to claim 6, wherein selecting the storage strategy comprises selecting a decoding process for reading the at least one set of data bits.

9. The method according to claim 1, wherein selecting the storage strategy comprises modifying a programming parameter used in storing the at least one group of the data bits.

10. The method according to claim 1, wherein storing the first and second data bits comprises applying to the memory cells a sequence of programming pulses that incrementally increase by a step size, and wherein selecting the storage strategy comprises modifying the step size.

11. The method according to claim 1, wherein storing the first and second data bits comprises encoding the at least one group of the data bits with an Error Correction Code (ECC), and wherein selecting the storage strategy comprises modifying a redundancy level of the ECC.

12. The method according to claim 1, wherein programming the memory cells to assume the first and second programming levels comprises writing to the cells predefined storage values that correspond to the respective programming levels and are separated from one another by predefined separations, and wherein selecting the storage strategy comprises modifying a separation between at least two programming levels selected from among the first and second programming levels.

13. The method according to claim 1, wherein storing the second data bits comprises retrieving the stored first data bits from the memory cells, caching the retrieved first data bits in a buffer and computing the second programming levels based on the cached first data bits and the second data bits, and wherein selecting the storage strategy comprises correcting errors in the cached first data bits and re-writing the first data bits, after correction of the errors, to the buffer prior to computing the second programming levels.

14. The method according to claim 1, wherein storing the second data bits comprises retrieving the stored first data bits from the memory cells, caching the retrieved first data bits in a buffer and computing the second programming levels based on the cached first data bits and the second data bits, and wherein selecting the storage strategy comprises:
correcting errors in the cached first data bits to produce error-corrected bits;
re-retrieving the first data bits from the memory cells after storage of the second data bits; and
selecting the storage strategy responsively to a discrepancy between the error-corrected bits and the re-retrieved first data bits.

15. The method according to claim 1, wherein selecting the storage strategy comprises:
retrieving at least part of the stored first data bits from the memory cells using one or more read thresholds;

processing the retrieved first data bits so as to modify the read thresholds;

re-retrieving the first data bits from the memory cells using the modified read thresholds; and computing the second programming levels responsively to the second data bits and the re-retrieved first data bits.

16. The method according to claim 15, wherein processing the retrieved first data bits comprises detecting errors in the retrieved first data bits and modifying the read thresholds responsively to the detected errors.

17. Apparatus for data storage, comprising:
programming circuitry, which is coupled to store first data bits in a set of multi-bit analog memory cells at a first time by programming the memory cells to assume respective first programming levels, and to store second data bits in the set of memory cells at a second time that is later than the first time by programming the memory cells to assume respective second programming levels that depend on the first programming levels and on the second data bits; and a processor, which is configured to predefine a continuous-programming storage strategy and a discontinuous-programming storage strategy, to estimate a time difference that elapsed between the first time and the second time, and to select a storage strategy, by choosing the continuous-programming storage strategy when the time difference is below a predefined time threshold and choosing the discontinuous-programming storage strategy when the time difference is above the predefined time threshold, wherein the selected storage strategy is applied to at least one group of the data bits, selected from among the first data bits and the second data bits.

18. The apparatus according to claim 17, wherein the processor is configured to select the storage strategy at the first time following storage of the first data bits.

19. The apparatus according to claim 18, wherein the processor is configured to select the storage strategy by drawing an inference with respect to the time difference based on a status of the memory cells following the storage of the first data bits.

20. The apparatus according to claim 19, wherein the processor is configured to draw the inference by detecting that the set of the memory cells is partially-programmed following the storage of the first data bits.

21. The apparatus according to claim 17, wherein the processor is configured to select the storage strategy at the second time.

22. The apparatus according to claim 17, and comprising reading circuitry, which is coupled to read from the memory cells at least one set of the stored data bits, selected from among the first data bits and the second data bits, wherein the processor is configured to apply the storage strategy in reading the at least one set of data bits.

23. The apparatus according to claim 22, wherein the processor is configured to select the storage strategy by determining read thresholds to be used in reading the at least one set of data bits.

24. The apparatus according to claim 22, wherein the processor is configured to select the storage strategy by selecting a decoding process for reading the at least one set of data bits.

25. The apparatus according to claim 17, wherein the processor is configured to select the storage strategy by modifying a programming parameter used in storing the at least one group of the data bits.

26. The apparatus according to claim 17, wherein the programming circuitry is coupled to store the first and second data bits by applying to the memory cells a sequence of programming pulses that incrementally increase by a step size, and wherein the processor is configured to select the storage strategy by modifying the step size.

27. The apparatus according to claim 17, wherein the processor is configured to encode the at least one group of the data bits with an Error Correction Code (ECC), and to select the storage strategy by modifying a redundancy level of the ECC.

28. The apparatus according to claim 17, wherein the programming circuitry is coupled to program the memory cells to assume the first and second programming levels by writing to the cells predefined storage values that correspond to the respective programming levels and are separated from one another by predefined separations, and wherein the processor is configured to select the storage strategy by modifying a separation between at least two programming levels selected from among the first and second programming levels.

29. The apparatus according to claim 17, and comprising reading circuitry, which comprises a buffer and is coupled to retrieve the stored first data bits from the memory cells, to cache the retrieved first data bits in the buffer and to compute the second programming levels based on the cached first data bits and the second data bits, wherein the processor is configured to correct errors in the cached first data bits and to re-write the first data bits, after correction of the errors, to the buffer prior to computing the second programming levels.

30. The apparatus according to claim 17, and comprising reading circuitry, which comprises a buffer and is coupled to retrieve the stored first data bits from the memory cells, to cache the retrieved first data bits in the buffer and to compute the second programming levels based on the cached first data bits and the second data bits, wherein the processor is configured to correct errors in the cached first data bits to produce error-corrected bits, to re-retrieve the first data bits from the memory cells after storage of the second data bits, and to select the storage strategy responsively to a discrepancy between the error-corrected bits and the re-retrieved first data bits.

31. The apparatus according to claim 17, and comprising reading circuitry, which is coupled to retrieve at least part of the stored first data bits from the memory cells using one or more read thresholds, wherein the processor is configured to process the retrieved first data bits so as to modify the read thresholds, to cause the reading circuitry to re-retrieve the first data bits from the memory cells using the modified read thresholds, and to compute the second programming levels responsively to the second data bits and the re-retrieved first data bits.

32. The apparatus according to claim 31, wherein the processor is configured to detect errors in the retrieved first data bits and to modify the read thresholds responsively to the detected errors.

33. Apparatus for data storage, comprising:
a memory comprising a set of multi-bit analog memory cells;

programming circuitry, which is coupled to store first data bits in the set of multi-bit analog memory cells at a first time by programming the memory cells to assume respective first programming levels, and to store second data bits in the set of memory cells at a second time that is later than the first time by programming the memory cells to assume respective second programming levels that depend on the first programming levels and on the second data bits; and a processor, which is configured to predefine a continuous-programming storage strategy and a discontinuous-programming storage strategy, to estimate a time difference that elapsed between the first time and the second time, and to select a storage strategy, by choosing the continuous-programming storage strategy when the time difference is below a predefined time threshold and choosing the discontinuous-programming storage strategy when the time difference is above the predefined time threshold, wherein the selected storage strategy is applied to at least one group of the data bits, selected from among the first data bits and the second data bits.

* * * * *